(12) United States Patent
Jacobs et al.

(10) Patent No.: US 7,432,687 B2
(45) Date of Patent: Oct. 7, 2008

(54) HIGH EFFICIENCY SWITCHING POWER SUPPLY

(75) Inventors: James K. Jacobs, Toronto (CA); Sankar DasGupta, Mississauga (CA); David Vandermeer, Waterdown (CA)

(73) Assignee: Electrovaya Inc., Mississauga (CA)

( * ) Notice: Subject to any disclaimer, the term of this patent is extended or adjusted under 35 U.S.C. 154(b) by 205 days.

(21) Appl. No.: 11/193,630

(22) Filed: Aug. 1, 2005

(65) Prior Publication Data

US 2006/0119329 A1 Jun. 8, 2006

Related U.S. Application Data

(60) Provisional application No. 60/657,417, filed on Mar. 2, 2005, provisional application No. 60/656,914, filed on Mar. 1, 2005, provisional application No. 60/656,913, filed on Mar. 1, 2005, provisional application No. 60/656,889, filed on Mar. 1, 2005, provisional application No. 60/656,911, filed on Mar. 1, 2005, provisional application No. 60/592,386, filed on Aug. 2, 2004.

(51) Int. Cl.
G05F 1/10 (2006.01)
G05F 1/44 (2006.01)

(52) U.S. Cl. ................................ 323/222; 323/284

(58) Field of Classification Search ................ 323/222, 323/224, 259, 282, 283, 284, 344; 320/112
See application file for complete search history.

(56) References Cited

U.S. PATENT DOCUMENTS 4,495,554 A 1/1985 Simi et al.
5,734,258 A * 3/1998 Esser .......................... 323/224
5,982,160 A 11/1999 Walters et al.
6,348,784 B1 2/2002 Gofman et al.
6,377,032 B1 4/2002 Andruzzi et al.
2002/0017897 A1 2/2002 Wicox et al.
2002/0036486 A1 3/2002 Zhou et al.
2002/0047309 A1 4/2002 Droppo et al.
2002/0089313 A1 7/2002 Shashoua
2003/0214271 A1 11/2003 Bradley
2004/0100807 A1 5/2004 MacDonald et al.
2004/0119448 A1 6/2004 Wiegand et al.
2005/0194937 A1 9/2005 Jacobs

OTHER PUBLICATIONS

Linear Technology, "LTC3780 High Efficiency, Synchronous, 4-Switch Buck-Boost Controller", Jan. 1, 2004, two pages, published at: linear.com website.

* cited by examiner

*Primary Examiner*—Jessica Han

(57) ABSTRACT

A high efficiency switching power supply including an analog front end, a battery control circuitry portion, a display and equalization circuitry portion, field effect transistor (FET) drivers, an isolated power supply transformer circuitry (and three associated sets of tap circuitry), microcontroller circuitry, oscillator circuitry, overcharge protection circuitry, programmable logic circuitry portion, and a zero current predictor. Overbiasing of the FET power supply switches, and/or other various circuitry features disclosed herein, helps achieve electrical power efficiencies of preferably greater than 95%, even more preferably greater than 98% and even more preferably greater than 99%. Preferably, the switching power supply has one or more of the following: (1) high electrical power efficiency (>95%, >98%, >99%); (2) overbiasing of a gate of a power supply switch; (3) a power supply switch with a low gate capacitance ratio; (4) multiple modes of operation; and (5) current prediction wherein an inductor voltage is used to control a constant current capacitor whose voltage indicates the level of current in the inductor.

11 Claims, 25 Drawing Sheets

Fig. 6  50, 400

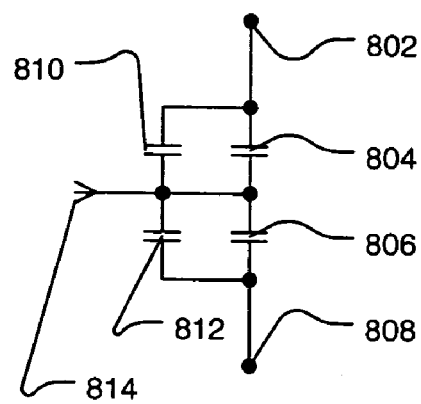
Fig. 11 50, 800
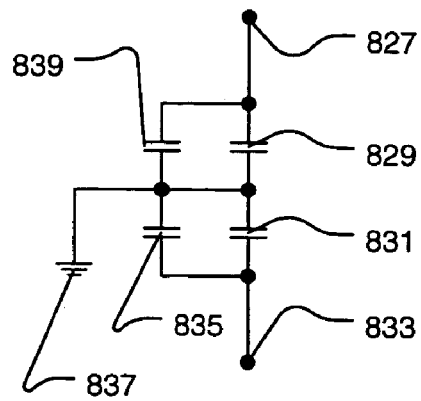
Fig. 12 50, 825
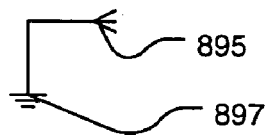
Fig. 15
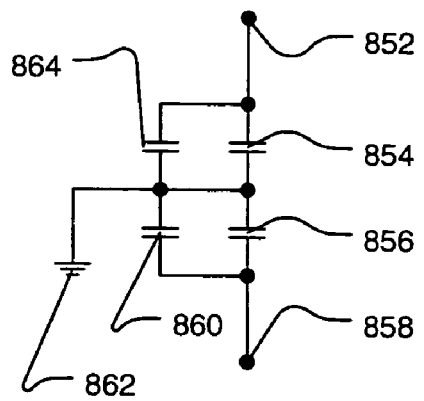
Fig. 13 50, 850
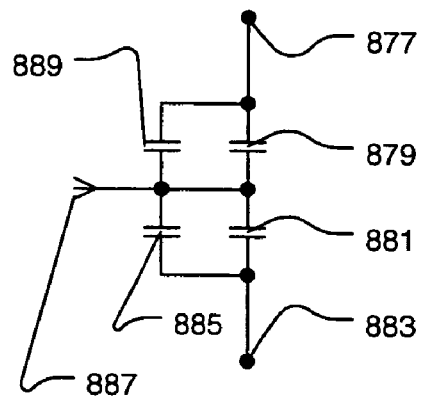
Fig. 14 50, 875

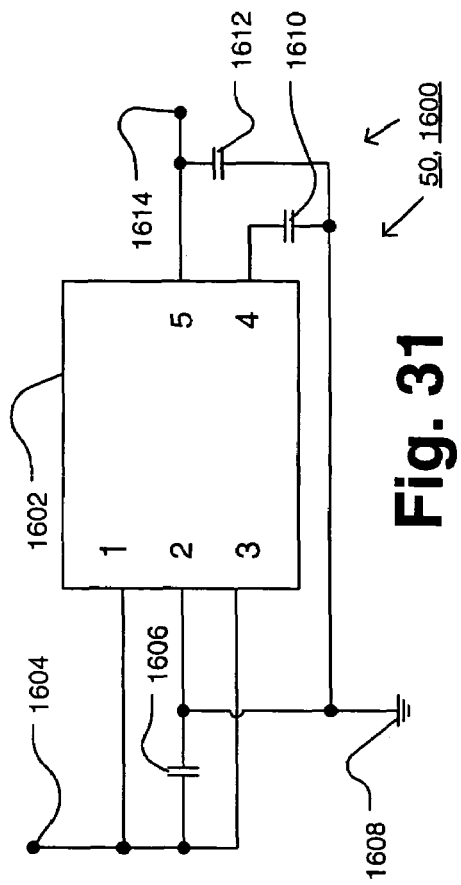
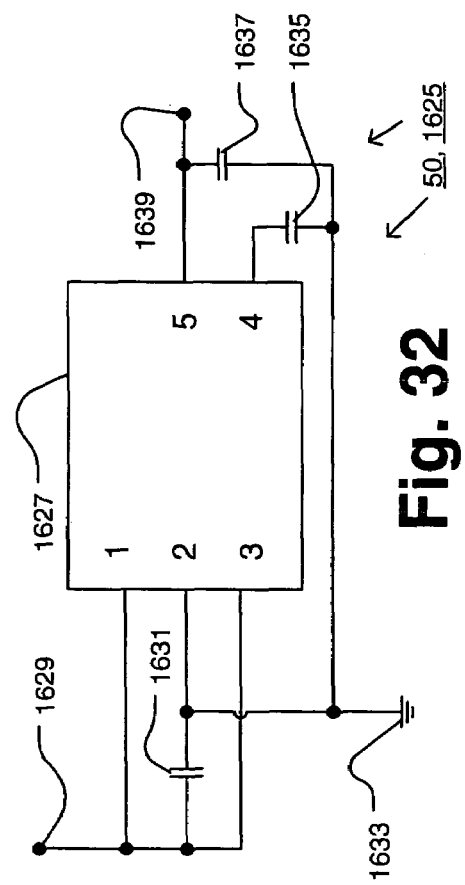
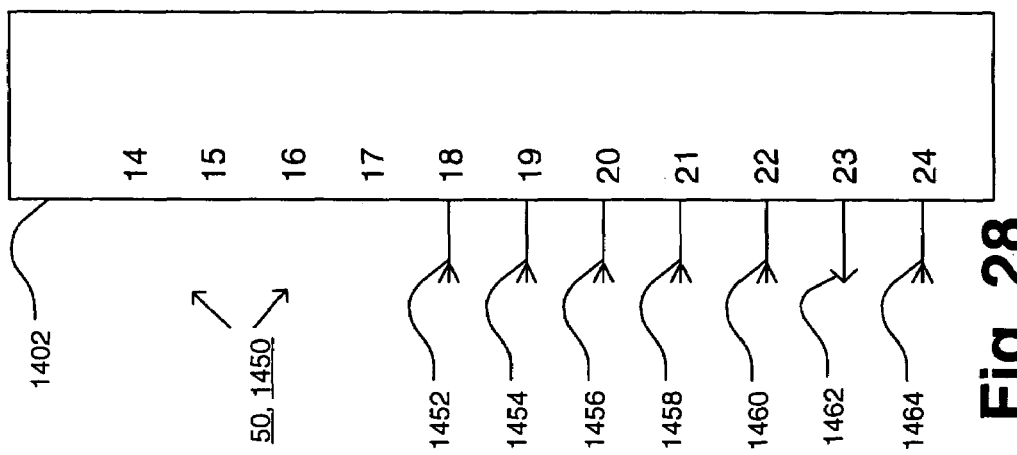

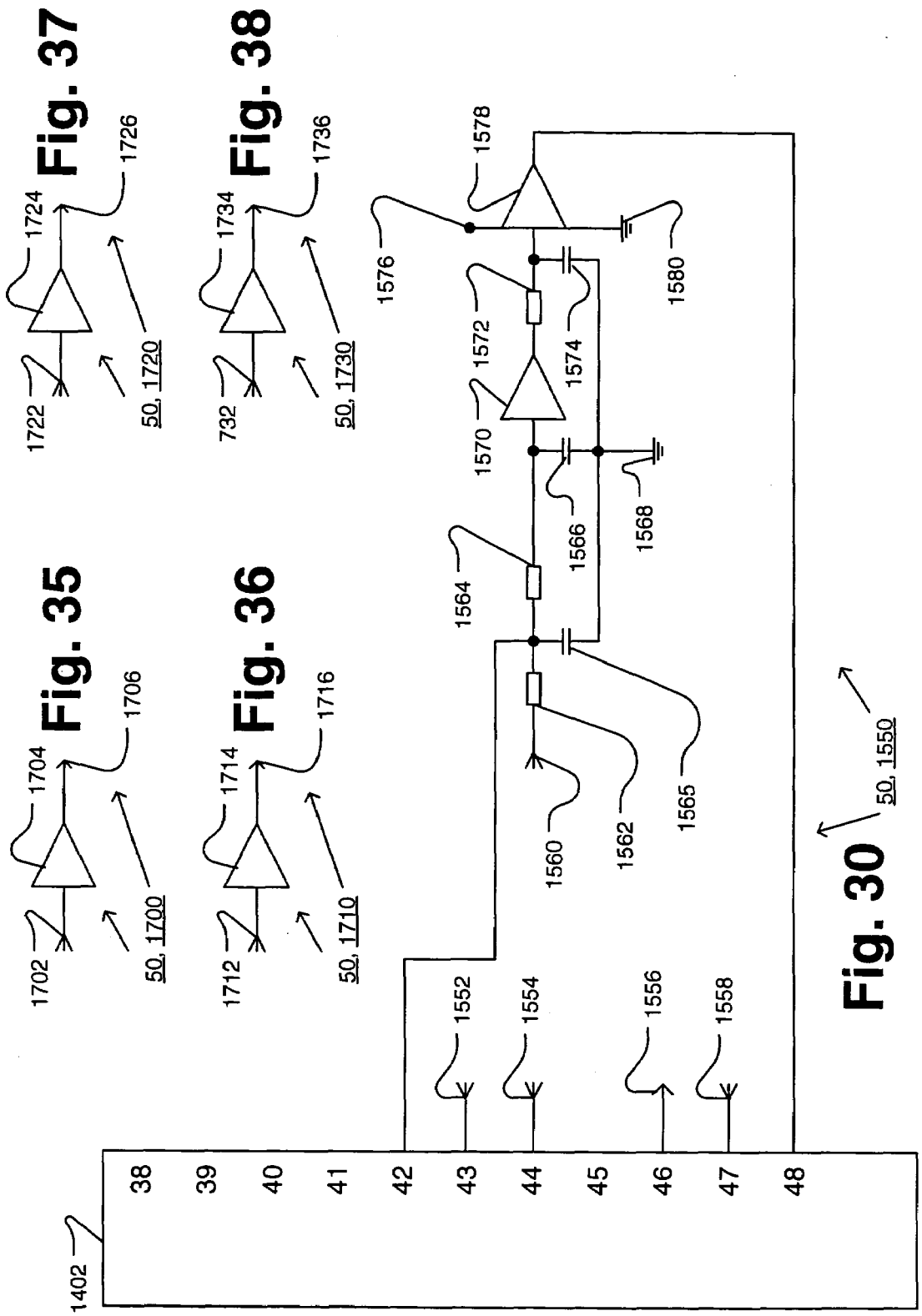

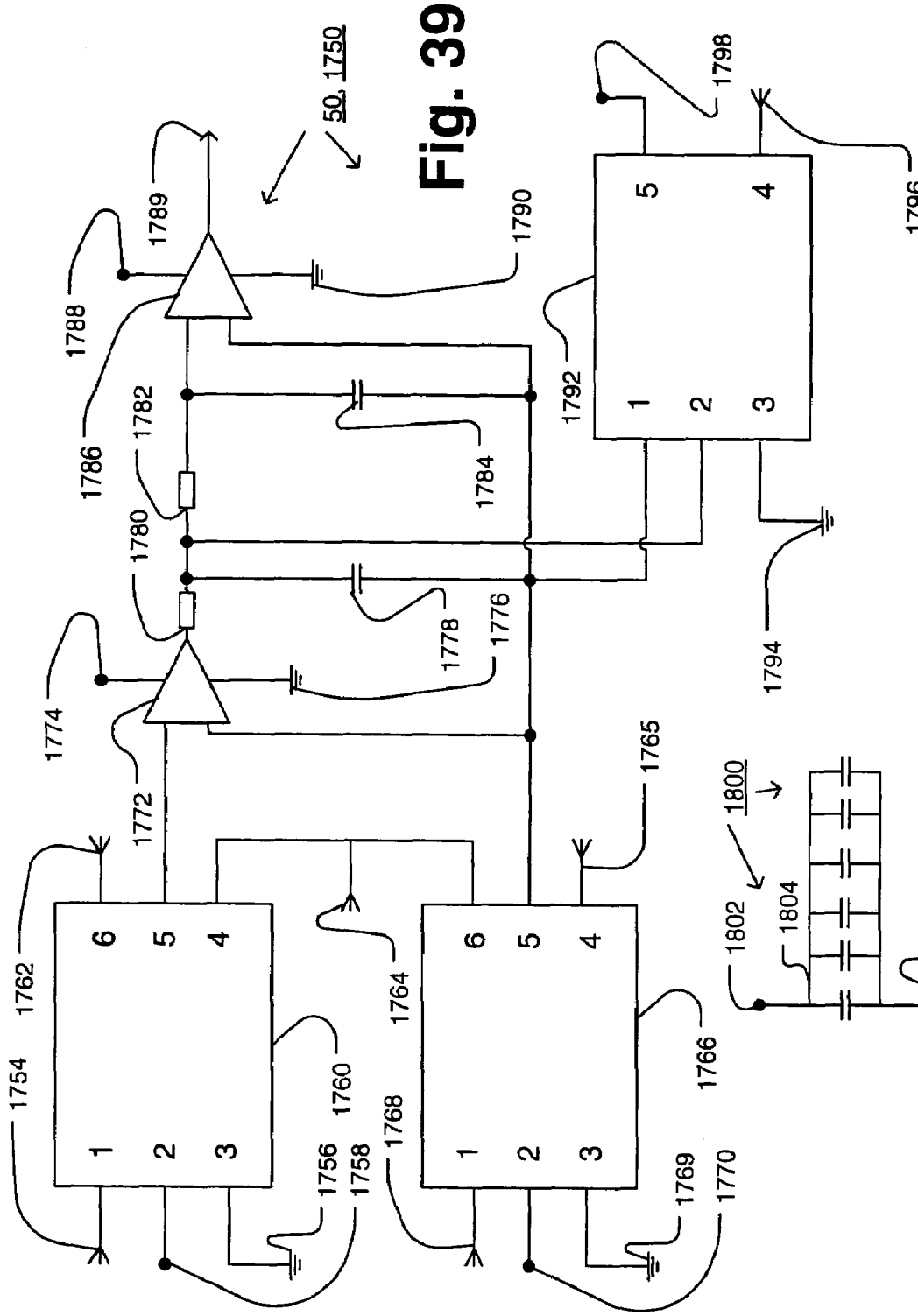

US 7,432,687 B2

HIGH EFFICIENCY SWITCHING POWER SUPPLY

RELATED APPLICATION DATA

This application claims any and all applicable benefits based on the following provisional patent application(s): (1) U.S. patent application No. 60/592,386 filed on 2 Aug. 2004; (1) U.S. patent application No. 60/656,911 filed on 1 Mar. 2005; (2) U.S. patent application No. 60/656,889 filed on 1 Mar. 2005; (3) U.S. patent application No. 60/656,913 filed on 1 Mar. 2005; (4) U.S. patent application No. 60/657,417 filed on 2 Mar. 2005; and (5) U.S. patent application No. 60/656,914 filed on 1 Mar. 2005. All of the foregoing patent-related documents are herein incorporated by reference.

FIELD OF THE INVENTION

The present invention relates to power supplies and more particularly to high efficiency dc-dc converter switching power supplies.

DESCRIPTION OF THE RELATED ART

Power supplies and switching power supplies are well known and conventional. A switching power supply generally includes: (1) an input power signal (see DEFINITIONS section for definition of "power signal"); (2) a power supply switch set; (3) a passive component set; (4) a controller; and (5) an output power signal.

The power supply switch set includes at least one power supply switch that can be turned on and off. A switching power supply will often have more than one power supply switch in its switch set. Preferably, the switch(es) is/are constructed as transistor(s), such as a field effect transistor(s) (FET(s)). The passive component set is at least one passive component, such as an inductor or capacitor. A switching power supply will often have more than one passive component in its passive component set. The power supply switch set and passive component set are electrically interconnected so that when the power input signal flows into the interconnected circuitry of the power supply switch set and passive components, the opening and closing of the power supply switch(es) effectively convert the input power signal into the output power signal having some predetermined electrical characteristics (e.g., a regulated dc voltage).

In a switching power supply, the power supply switch(es) need to be actively controlled to open and close on an ongoing basis so that the output power signal will achieve and maintain its desired electrical characteristics. The controller exercises this control over the power supply switches. The controller uses logic (e.g., a programmed microcontroller) to analyze control input signals and send control output signals out to open and close the power supply switch(es). The control input signals represent information (e.g., voltages, current values) sensed at various portions of the switching power supply circuitry. For example, the voltage of the power input signal may be sent to the controller as one of the control input signals. If the voltage of the power input signal drops for a little while, the controller would generate its control output signals to operate the power supply switch set to compensate for voltage drop indicated by the power input signal voltage control input signal. It is noted that the controller may be distributed in space and/or amongst separate components.

U.S. published patent application publication No. 2002/0017897 ("Wilcox") discloses a switching voltage regulator which is alleged to exhibit high efficiency over broad current ranges, including low output currents. Wilcox further states that its disclosed control circuit can facilitate over 90% efficiency in a 5-volt synchronous switching regulator for an input voltage of approximately 10 volts. Wilcox further states that efficiencies of over 95% can be maintained. The Wilcox switching regulator generates a control signal to turn switching resistors off when voltage at the output can be effectively maintained at the regulated voltage by the charge on an output capacitor.

U.S. Pat. No. 4,495,554 ("Simi") discloses a switching power supply wherein the input elements, including the controller, are fully isolated by a transformer. Simi explains the way in which its switching power supply uses the technique of overbiasing: "Thus, during each period in which controller 51 gates FET 9 on, transistor 19 is driven on. Transistor 19 is overbiased and can conduct any amount of current which might be provided by line 33. During the other periods, transistor 19 is positively driven off. Diode 20 is then forward biased and provides a shunt to ground which protects transistor 19. As transistor 19 is turned on, current flows through the primary of transformer 35, bypassing diode 37 and resistor 39 since transistor 19 constitutes a direct path to the ground reference potential."

U.S. Pat. No. 6,348,784 ("Gofman") discloses a switching power supply including a series regulator circuit. The regulator circuit includes a MOSFET that operates with voltage biasing circuitry. The voltage biasing circuitry offsets a voltage level between the gate and drain terminals to reduce the difference in voltage between the drain and the source terminals associated with the gate-to-source threshold voltage. This biasing thereby reduces the power dissipated within the series regulator element.

U.S. published patent application publication No. 2004/0119448 ("Wiegand") discloses a controller apparatus that varies the amplitude of an electrical power supply voltage. Wiegand states: "The controller apparatus . . . may be used to implement all otherwise conventional converter types, buck, boost, and inverting (and duals of these) version to obtain different regulating characteristics. . . ."

U.S. published patent application publication No. 2004/0100807 ("MacDonald") discloses a dual input AC/DC power converter with dual programmable DC voltage outputs. The power converter includes an AC-to-DC converter, a DC-to-DC booster converter, and a DC-to-DC buck converter. The two programmable DC output voltages may be generated as a function of both AC and DC input voltages.

U.S. published patent application 2003/0214271 ("Bradley") discloses a system for bi-directional power conversion in a portable device with a battery, particularly wireless communications devices. Bradley states: "The invention . . . us[es] a single inductor to perform both buck and boost power conversion operations . . . thereby reducing the number of components. . . ."

U.S. Pat. No. 6,377,032 ("Andruzzi") discloses an apparatus for virtual current sensing in a DC-DC switched mode power supply. A programmable current source charges a current sensing capacitor and the voltage across the capacitor simulates the rising slope of the voltage across a conventional current sensing resistor. A ramp capacitor is charged by a second programmable current source. The sum of the voltages across the capacitors is used to discharge the current sensing capacitor to simulate the falling slope of current across a conventional resistor.

U.S. Pat. No. 5,982,160 ("Walters") discloses a DC-DC converter that provides sensing of the output current for regulation. The DC-DC converter includes a power switch, an output inductor connected across the power switch and a current sensor connected in parallel with the inductor. The current sensor includes a resistor and a capacitor, preferably with fast values.

Description Of the Related Art Section Disclaimer: To the extent that specific publications are discussed above in this Background section, these discussions should not be taken as an admission that the discussed publications (e. g., patents) are prior art for patent law purposes. For example, some or all of the discussed publications may not be sufficiently early in time, may not reflect subject matter developed early enough in time and/or may not be sufficiently enabling so as to amount to prior art for patent law purposes.

SUMMARY OF THE INVENTION

The present invention relates to switching power supplies and circuitry portions of switching power supplies. Preferably, the switching power supply has one or more of the following: (1) high electrical power efficiency (>95%. >98%, >99%); (2) overbiasing of a gate of a power supply switch; (3) a power supply switch with a low gate capacitance ratio; (4) multiple modes of operation; and (5) current prediction wherein an inductor voltage is used to control a constant current capacitor whose voltage indicates the level of current in the inductor.

Various embodiments of the present invention may exhibit one or more of the following objects, features and/or advantages:

(1) higher power efficiency switching power supply;

(2) more reliable switching power supply (e.g, reduces or eliminates phantom switching);

(3) a switching power supply advantageous for use with rechargeable electrochemical cells (e.g., lithium ion polymer batteries);

(4) a less expensive switching power supply;

(5) switching power supply with isolated reference voltages for powering the controller;

(6) power supply with both variable frequency and variable duty cycle;

(7) switching power supply including optical signals; and (8) switching power supply wherein control signals driving the power supply switch(es) and transmitted through a capacitive coupling.

According to one aspect of the present invention, a switching power supply includes a power signal input, a power signal output, a passive component set, an active component set, driver/controller circuitry. The power signal input is structured as circuitry for providing an input electrical power signal to the switching power supply. The power signal output is structured as circuitry for providing an output electrical power signal from the switching power supply. The passive component set includes at least one passive component. The active component set includes at least one power supply switch. The active component set is electrically interconnected to the passive component set so that a switch position of the at least one power supply switch at least partially controls the flow of electrical power through the passive component set. The driver/controller circuitry structured to control at least the opening and closing of the at least one switch of the active component set. The driver/controller circuitry, the active component set and the passive component set are structured, programmed and/or electrically interconnected to convert the input electrical power signal into a desired output electrical power signal. The switching power supply has an electrical power efficiency greater than 95% at typical operating voltages.

According to a further aspect of the present invention, a switching power supply includes a power signal input, a power signal output, a passive component set, an active component set, driver/controller circuitry. The power signal input is structured as circuitry for providing an input electrical power signal to the switching power supply. The power signal output structured as circuitry for providing an output electrical power signal from the switching power supply. The passive component set includes at least one passive component. The active component set includes at least a first power supply switch, with the active component set being electrically interconnected to the passive component set so that a switch position of the first power supply switch at least partially controls the flow of electrical power through the passive component set. The first power supply switch includes a source having a source voltage, a drain having a drain voltage, and a gate having a gate voltage referenced to a gate reference voltage. The driver/controller circuitry is structured to control at least the opening and closing of the at least one switch of the active component set. The driver/controller circuitry, the active component set and the passive component set are structured, programmed and/or electrically interconnected to convert the input electrical power signal into a desired output electrical power signal. The driver controller circuitry includes gate reference voltage generator circuitry structured and electrically interconnected to apply the gate reference voltage to the gate. The gate reference voltage is offset from the drain voltage in an amount reasonable to compensate for gate capacitance effect on the gate voltage.

According to a further aspect of the present invention, a switching power supply includes a power signal input, a power signal output, a passive component set, an active component set, driver/controller circuitry. The power signal input is structured as circuitry for providing an input electrical power signal to the switching power supply. The power signal output is structured as circuitry for providing an output electrical power signal from the switching power supply. The passive component set includes at least one passive component. The active component set includes at least a first power supply switch, with the active component set being electrically interconnected to the passive component set so that a switch position of the first power supply switch at least partially controls the flow of electrical power through the passive component set. The first power supply switch includes a source having a source voltage, a drain having a drain voltage, a gate having a gate voltage referenced to a gate reference voltage, an inherent gate-to-source capacitance, and inherent gate-to-drain capacitance. The gate capacitance ratio is defined as the gate-to-source capacitance divided by the gate-to-drain capacitance. The driver/controller circuitry is structured to control at least the opening and closing of the at least one switch of the active component set. The driver/controller circuitry, the active component set and the passive component set are structured, programmed and/or electrically interconnected to convert the input electrical power signal into a desired output electrical power signal. The gate capacitance ratio is less than 0.1.

BRIEF DESCRIPTION OF THE DRAWINGS

FIG. 11 is a capacitor set for use in the first embodiment power supply;

FIG. 12 is a capacitor set for use in the first embodiment power supply;

FIG. 13 is a capacitor set for use in the first embodiment power supply;

FIG. 14 is a capacitor set for use in the first embodiment power supply;

FIG. 15 is an input and ground for use in the first embodiment power supply;

FIG. 28 is a programmable logic second portion of the first embodiment power supply;

FIG. 30 is a programmable logic fourth portion of the first embodiment power supply;

FIG. 31 is a programmable logic fifth potion of the first embodiment power supply;

FIG. 32 is a programmable logic sixth potion of the first embodiment power supply;

FIG. 35 is a programmable logic ninth potion of the first embodiment power supply;

FIG. 36 is a programmable logic tenth potion of the first embodiment power supply;

FIG. 37 is a programmable logic eleventh potion of the first embodiment power supply;

FIG. 38 is a programmable logic twelfth potion of the first embodiment power supply;

FIG. 39 is a zero current predictor of the first embodiment power supply;

FIG. 40 is a capacitor set for use in the first embodiment power supply;

DETAILED DESCRIPTION OF SOME EMBODIMENTS

Figure 1A:
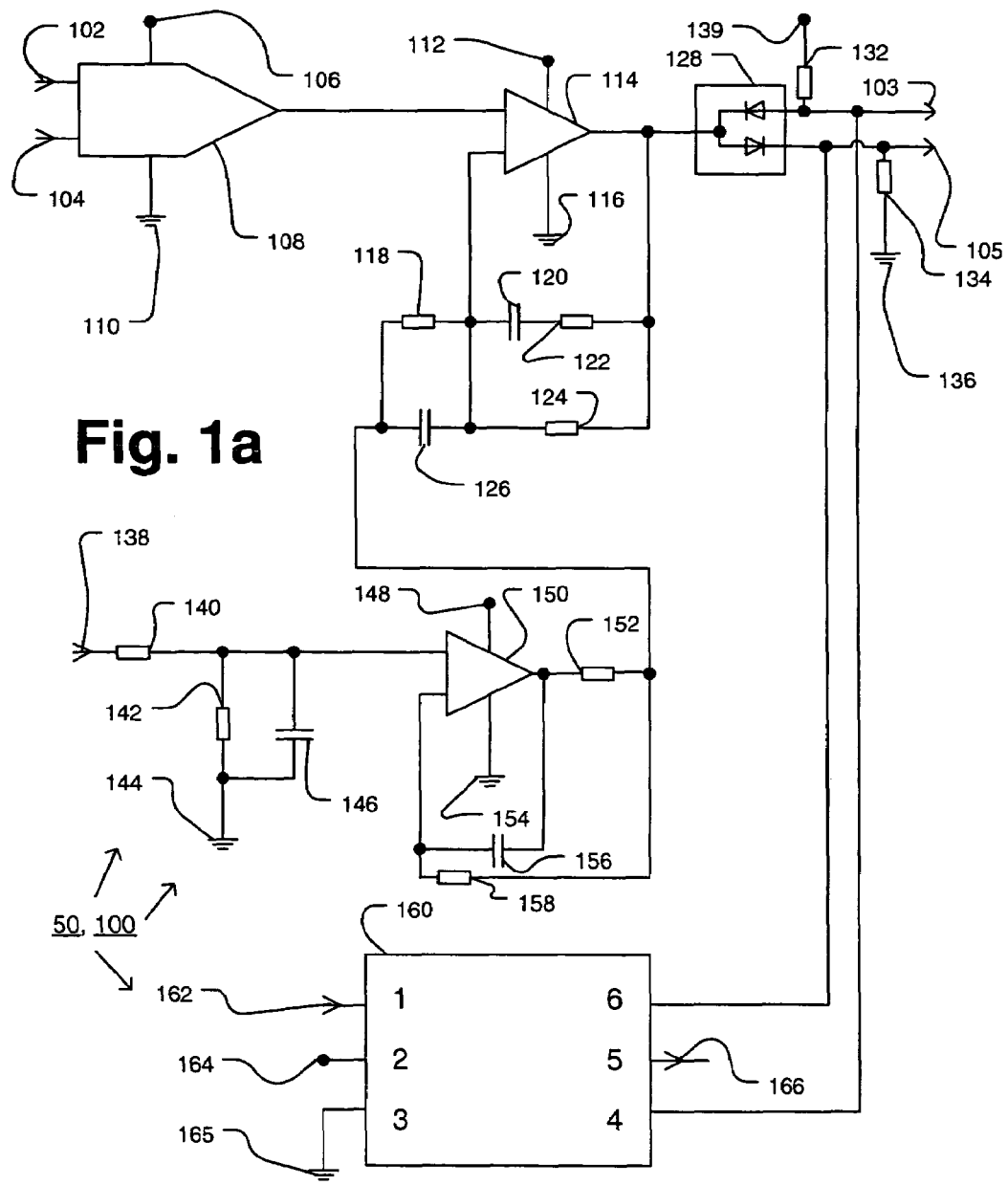
FIG. 1a is an analog front end first portion of a first embodiment of a switching power supply.

The following exemplary embodiment(s) of a switching power supply will be given in the context of a switching power supply used in a battery device. More particularly, the battery device (not separately shown in the Figs.) includes the switching power supply and rechargeable electrochemical cells (preferably lithium ion or lithium polymer cells) in a housing. One or more jacks at an external surface of the housing allow external devices to be electrically connected and disconnected from the switching power supply. Because it is electrically interposed between the external device(s) and the electrochemical cells, the switching power supply here controls the charging and discharging of the electrochemical cells. Specifically, an external power source can be connected via a jack to recharge the electrochemical cells when they have been drained of charge. Alternatively (or additionally) an external load can be connected. This external load can then be powered by the electrochemical cells via the switching power supply. In some preferred embodiments of the present invention, only one jack is provided, and this jack is used both to charge and discharge the electrochemical cells.

The voltage regulation and other functionality provided to the battery device by the switching power supply can preferably handle both a multiple external charging source voltage levels and multiple external load voltage levels. This robustness with respect to voltage levels of the external devices helps make the battery device compatible with a greater variety of charging sources and/or external load applications. Also, it is preferable that the switching power supply have a high electrical power efficiency. For these reasons, the switching power of the present invention supports six modes of operation: (1) buck charge; (2) buck discharge; (3) boost charge; (4) boost discharge; (5) off; and (6) pass through.

Although the switching power supply is explained in terms of its specific role in this battery device with its electrochemical cells, it is strenuously noted that switching power supplies of the present invention are not limited to this application. All kinds of electrical devices, such as general purpose computers, use switching power supplies and the present invention is accordingly widely applicable to a wide range of applications now known or to be developed in the future. Although the regulation in other electrical devices will not generally be considered as charge and discharge voltage, the bidirectional regulation feature will often be helpful in contexts besides electrochemical cell charging and/or discharging. Also, many of the other features, such as high electrical power efficiency, will also be beneficial across many applications of the switching power supplies of the present invention.

The circuitry and operation of exemplary switching dc-dc converter power supply 50 will now be discussed with reference to FIGS. 1 to 42. In this exemplary embodiment, the dc-dc converter power supply is used in conjunction with rechargeable electrochemical cells (not shown). More particularly, one side of the power supply is connected across a set of electrochemical cells and the other side is connected to an external source or load. When the power supply is connected to an outside source of electrical power, the electrochemical cells are charged. The power supply makes sure that appropriate charging voltages are supplied to the cells, despite possible fluctuations or variances in the external charging supply. The power supply can also help prevent overcharging of the cells. On the other hand, when an external load is connected to the power supply, the power supply converts power discharged from the cells into power of an appropriate level and regulation for the external load. The power supply is robust because it can operate in any one of five modes: (1) boost charging mode; (2) boost discharging mode; (3) buck charging mode; (4) buck discharging mode; and (5) pass mode. While the exemplary power supply 50 is in some ways tailored to this rechargeable electrochemical cells application, it should be understood that the present invention is not necessarily so limited and that power supply 50 and/or other power supplies within the scope of the present invention may be used in a wide range of other power supply applications.

Supply 50 includes analog front end first portion 100; analog front end second portion 101; battery control first portion 225; battery control second portion 226; display and equalization first portion 300; display and equalization second portion 400; first field effect transistor (FET) driver 475; second field effect transistor (FET) driver 525; third field effect transistor (FET) driver 575; fourth field effect transistor (FET) driver 625; isolated power supply transformer circuitry 900; first tap circuitry 950; second tap circuitry 975; third tap circuitry 1000; microcontroller circuitry first portion 1025; microcontroller circuitry second portion 1100; microcontroller circuitry third portion 1125; oscillator circuitry 1200; overcharge protection circuitry first portion 1300; overcharge protection circuitry second portion 1350; programmable logic first portion 1400; programmable logic second portion 1450; programmable logic third portion 1500; programmable logic fourth portion 1550; programmable logic fifth potion 1600; programmable logic sixth potion 1625; programmable logic seventh potion 1650; programmable logic eighth potion 1675; programmable logic ninth potion 1700; programmable logic tenth potion 1710; programmable logic eleventh potion 1720; programmable logic twelfth potion 1730; and zero current predictor 1750.

Referring to FIG. 1a, analog front end first portion 100 includes inputs 102, 104, 138, 162; outputs 103, 105, 166; terminals 106, 112, 139, 148, 164; grounds (digital or analog, as appropriate) 110, 116, 136, 144, 154, 165; resistors 118, 122, 124, 132, 134, 140, 142, 152, 158; capacitors 120, 126, 146, 156; six port processing circuit 160; operational amplifiers 114, 150; digital-to-analog (D/A) converter 108; and two diode package 128.

The circuit elements of the analog front end first portion are electrically interconnected as shown in FIG. 1a. The following paragraph sets forth preferred electrical characteristics for some of the elements of the analog front end first portion. For proper reading of this kind of electrical characteristics paragraph throughout this document, unless otherwise noted: (1) the notation DNP means Do Not Populate; (2) terminal values are given in volts; (3) resistor values are given in ohms; (4) capacitor values are give in picofarads (pF), nanofarads (nF) or microfarads (µF); (5) inputs are matched to corresponding outputs; and (6) outputs are matched to corresponding inputs.

Preferred electrical characteristics for some of the components are now set forth in parentheses after each element: input 102 (serial data port B); input 104 (serial clock port B); input 138 (Charge Supply); input 162 (Charge Discharge); output 103 (input 107); output 105 (input 109); output 166 (Duty Cycle Control); terminal 106 (+5.4); terminal 112 (+5.4); terminal 139 (+5.4); terminal 148 (+5.4); terminal 164 (+5.4); resistor 118 (1M0); resistor 122 (0R); resistor 124 (DNP); resistor 132 (10K0); resistor 134 (10K0); resistor 140 (1M0); resistor 142 (143K); resistor 152 (1K0); resistor 158 (1K0); capacitor 120 (4700 pF); capacitor 126 (4700 pF); capacitor 146 (1000 pF); capacitor 156 (1K0); circuit 160, port 1 (Select); circuit 160, port 2 (V+); circuit 160, port 3 (GND); circuit 160, port 4 (NO); circuit 160, port 5 (COM); and circuit 160, port 6 (NC).

Converter 108 converts from digital to analog a signal representing the voltage that the power supply is to regulate. Preferably, converter model number MAX5382L from Maxim/Dallas of Sunnyvale, Calif. is used as converter 108 because of: (1) its I2C interface; and (2) adequate resolution.

Operational amplifier 114 generates an analog signal proportional to the difference between the actual output voltage and the desired output voltage. Operational amplifier 150 converts actual output voltage into a signal for comparison with signal generated by 108. Preferably model number TC1034 from Microchip of Chandler, Ariz. is selected for operational amplifiers 114, 150 because of its: (1) low power consumption; (2) rail to rail input output capability; and (3) small package size.

Processing circuit 160 selects one of two signals generated by the error amplifiers to feed to the oscillator on operating mode (e.g., boost charging, boost discharging, buck charging, buck discharging, pass). Preferably processing circuit 160 is selected as an NLAS4599 Analog Switch from ON Semiconductor because of: (1) small package size; and (2) low power consumption.

Figure 1B:
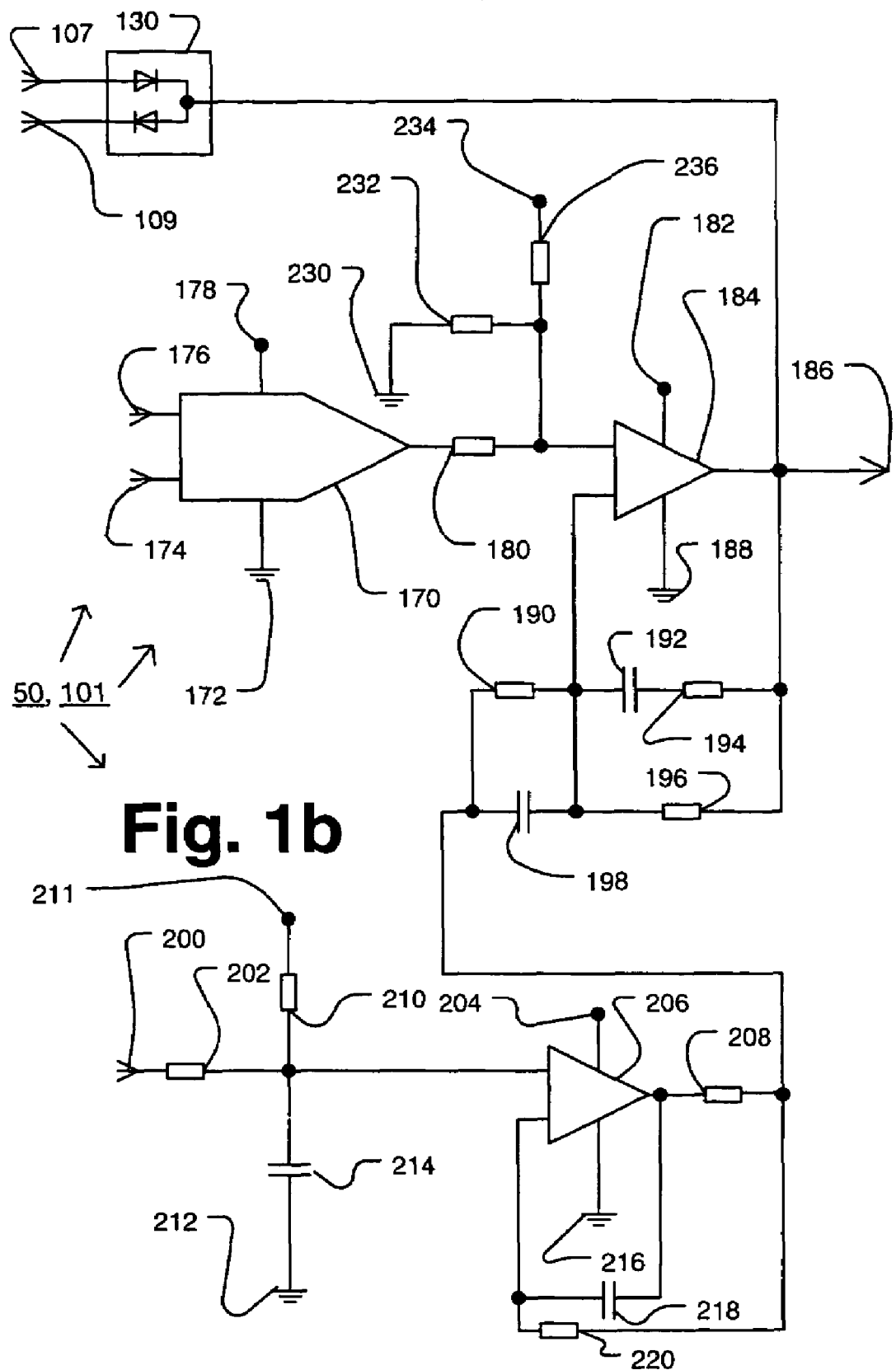
FIG. 1b is an analog front end second portion of the first embodiment power supply.

Referring to FIG. 1b, analog front end second portion 101 includes inputs 107, 109, 174, 176, 200; output 186; terminals 178, 182, 204, 211, 234; grounds (digital or analog, as appropriate) 172, 188, 212, 216, 230; resistors 180, 190, 194, 196, 202, 208, 210, 220, 232, 236; capacitors 192, 198, 214, 218; operational amplifiers 184, 206; D/A converter 170; and two diode package 130. The circuit elements of the analog front end second portion are electrically interconnected as shown in FIG. 1b.

Preferred electrical characteristics for some of the elements of the analog front end second portion are now set forth in parentheses after each element: input 107 (output 103); input 109 (output 105); input 174 (serial clock port B); input 176 (serial data port B); input 200 (IS+); output 186 (Ireg monitor); terminal 178 (+5.4); terminal 182 (+5.4); terminal 204 (+5.4); terminal 211 (+5.4); terminal 234 (+5.4); resistor 180 (100K); resistor 190 (1M0); resistor 194 (0R); resistor 196 (DNP); resistor 202 (100K); resistor 208 (1K0); resistor 210 (976K); resistor 220 (1K0); resistor 232 (2K05); resistor 236 (22K1); capacitor 192 (100 pF); capacitor 198 (100 pF); capacitor 214 (0.1 µF); capacitor 218 (100 pF).

Converter 170 converts from digital to analog a signal representing regulated current. Preferably, converter 170 is similar in construction to converter 108 discussed above. Operational amplifier 184 is preferably similar in construction to operational amplifier 114 discussed above, but operational amplifier 184 generates an error signal for current instead of voltage. Operational amplifier 206 is preferably similar in construction to operational amplifier 150 discussed above, but operational amplifier amplifies the current signal instead of voltage. As shown in FIGS. 1a and 1b, two diode packages 128, 130 work together to allow only the correct signal to pass to processing circuit 160. Specifically, only the higher or lower of the voltage and current error signal may pass, dependant on the operating mode of the converter. The two diode packages are preferably constructed as model BAV199LT1 from ON Semiconductor of Phoenix, Ariz.

Figures 2, 3A:
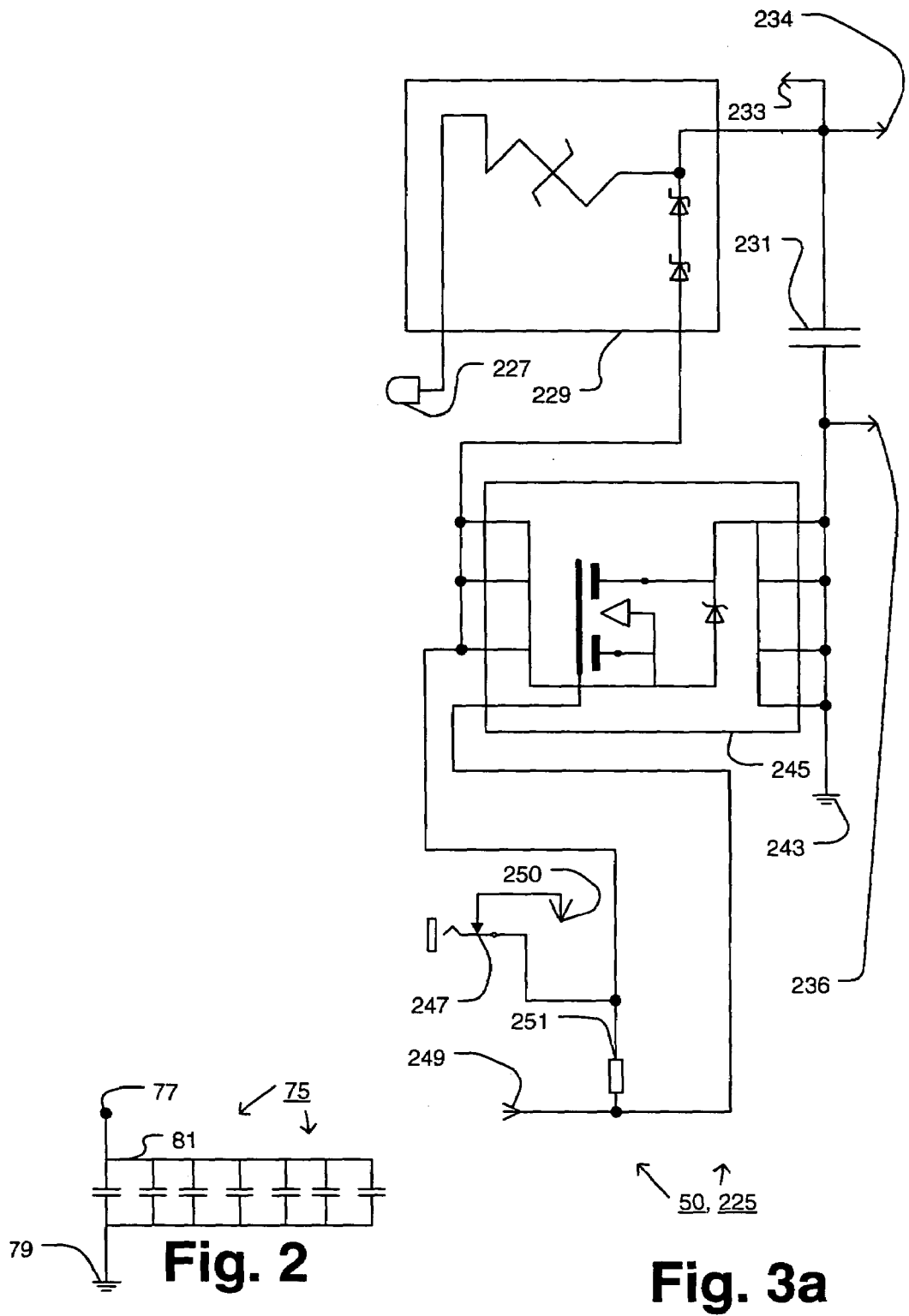
FIG. 2 is a capacitor set for use in the first embodiment power supply.
FIG. 3a is a battery control first portion of the first embodiment power supply.

FIG. 2 shows capacitor set 75 including +5.4 V terminal 77, ground 79 and eight parallel-connected, 0.1 μF capacitors 81. Capacitor set 75 are decoupling capacitors respectively associated with the ICs of FIGS. 1a and 1b.

Now that the circuitry of analog front end 100, 101 has been identified, its functionality will be briefly discussed. Generally speaking, the analog front end detects what can be considered as feedback or diagnostic information to compare the difference between the status of power flow in the switching power supply and the target levels of power flow that are desired at a given time. The switching power supply uses this feedback information to help control its switching operations on an ongoing basis so that dc-dc conversion and other power flow functions are controlled to be sufficiently close to desired levels.

More particularly, the analog front end compares the actual converter voltage and current with the desired voltage and current limits set by the microprocessor. The analog front end also generates an error voltage dependant on mode for input to the oscillator stage. The front end amplifiers are tuned circuits to provide the correct phase and gain response as a function of frequency to provide stable operational control. Voltage and current limiting work independent of one another, but provide a common error signal to the oscillator stage.

Referring to FIG. 3a, battery control first portion 225 includes input 249; outputs 233, 234, 236, 250; ground (digital or analog, as appropriate) 243; resistor 251; capacitor 231; DC jack terminals 227, 247; and input overvoltage protection circuit 229; and Metal Oxide Semiconductor Field Effect Transistor ("MOSFET") 245. The circuit elements of the battery control first portion are electrically interconnected as shown in FIG. 3a.

Preferred electrical characteristics for some of the components of the first battery control portion are now set forth in parentheses after each element: input 249 (Overcharge); output 233 (Charge Supply); output 234 (input 244); output 236 (input 246); output 250 (Jack Sense); and resistor 251 (1M0).

Capacitor 231 is preferably formed as a set of four parallel-connected capacitors, including two variable capacitors and two fixed 10 μF capacitors. Jack terminals 227, 247 allow the positive side of the input/output to be connected to external components (such as charging sources and discharging loads). Input overvoltage protection circuit 229 includes two transorbs and a polyswitch as shown in FIG. 3a. The transorbs behave like Zener diodes and will give off heat as voltage increases into an overvoltage. The polyswitch acts as a resettable thermal fuse. In the event of overvoltage, heat from the transorbs trips the polyswitch to thereby eliminate the overvoltage condition. Alternatively, other types of overvoltage protection, now known or to be developed in the future, could be used. MOSFET 245 prevents overcharge and is basically a switch that turns off in the event of potential overcharging. MOSFET 245 is preferably constructed as Model Si4886DY from Vishay Siliconix of Shelton, Conn.

Figure 3B:
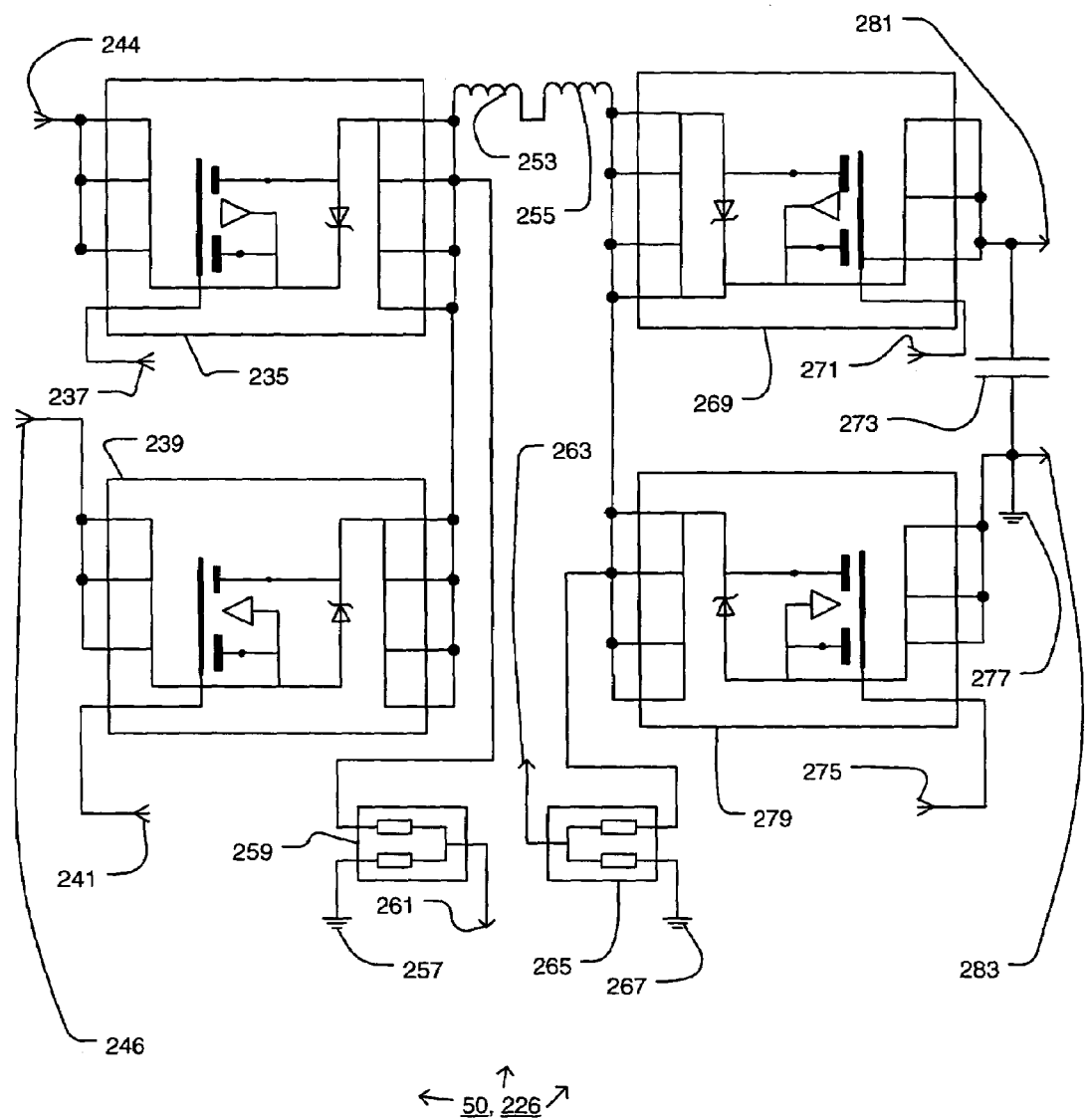
FIG. 3b is a battery control second portion of the first embodiment power supply.

Referring to FIG. 3b, battery control second portion 226 includes inputs 237, 241, 244, 246, 271, 275, 281, 283; outputs 261, 263; capacitor 273 (preferably constructed similar to capacitor 231); inductors 253, 255; grounds (digital or analog, as appropriate) 257, 267, 277; precision voltage dividers 259, 265; and MOSFETs 235, 239, 269, 279. The circuit elements of the battery control second portion are electrically interconnected as shown in FIG. 3b. Preferred electrical characteristics for some of the elements of the battery control second portion are now set forth in parentheses after each element: input 237 (Series a Gate); input 241 (Shunt a Gate); input 244 (output 234); input 246 (output 236); input 271 (Series B Gate); input 275 (Shunt B Gate); output 261 (Node A Signal); output 263 (Node B Signal); input 281 (Battery +); and input 283 (Battery −).

MOSFETS 235, 269 are preferably constructed as Model Si4835DY from Vishay Siliconix. MOSFETS 239, 279 are preferably constructed as Model Si4886DY from Vishay Siliconix. Inductors 253, 255 are preferably each 3.2 microhenry inductors with a saturation current of at least 8.6 amperes (A) at 25 degrees Celsius (C.). Of course, the combined inductance of these inductors connected in series is 6.4 microhenry. Alternatively, one larger inductor could be used here, but it is generally easier to obtain two small inductors rated at this high level of saturation current. Precision voltage dividers 259, 265 (or resistor networks) are preferably constructed as Model MPM2001/1002A from Vishay Thin Film of Shelton, Conn. In power supply 50, these MOSFETS 235, 239, 269, 279 are the power supply switches. In other power supply embodiments, other types of FETs, or other types of transistors, or even entirely different types of semiconductor devices, may be used for the power supply switches. Power supply switches are sometimes herein referred to as "power supply switch FETs."

Now that the circuitry of battery control 225, 226 has been identified, its primary functionality will be briefly discussed. Switching power supplies use passive (e.g., inductors, capacitors) and active (e.g., switches) components, working in conjunction, to accomplish the desired regulation (generally voltage regulation). In power supply 50, the passive components are capacitors 231, 271 and inductors 253, 255. The MOSFETs 235, 239, 269, 279 are the active components, or switches, of switching power supply 50. These four MOSFETs are structured to accomplish the five modes operation of power supply operation as identified above.

The precision voltage dividers 259, 265 are used to divide the voltages on either side of the inductor. The inductor voltage is used to predict a zero current condition and thereby help control in the efficient operation of the switching power supply. However, the voltage is divided because it is a high voltage that could damage the components used in making the zero current predictions. Alternatively, other hardware, now known or to be developed in the future, could be used to effect any necessary voltage decreases required by the zero current prediction circuitry.

Preferred switching power supplies according to the present invention have electrical power efficiencies (e.g., at 25 watt, full power) of upwards of 95%, 98% or even 99%. Some of the features that result in the very high efficiencies of the present invention are related to the driving of the power supply switches, in this embodiment MOSFETs 235, 239, 269, 279. Some inefficiencies in switching power supplies include: (1) gate charge of MOSFETS (active component set, frequency sensitive); (2) resistance drain to source ("RDS", active component set); (3) resistance loss of inductor (dc loss, frequency sensitive, less loss at high frequency); (4) capacitive losses (frequency sensitive, ESR: effective series resistance); (5) shunt loss (smaller shunt is preferred, not frequency sensitive); and (6) frequency inductance.

The transient resistance of the MOSFETs cause switching losses. The present invention reduces these switching losses through the use of high speed switching (>15 nanosecond rising edge, >10 nanosecond rising edge) and driver circuitry capable of fast, clean operation.

Phantom switching in the MOSFETs is another source of switching losses. The present operation compensates for phantom switching by overbiasing the gate voltages of the MOSFET power supply switches. Specifically, the gate voltage is adjusted, or biased, by some amount (typically 2 V) from the nominally expected values in whatever direction (+V, −V) will tend to compensate for phantom switching.

Figure 41:
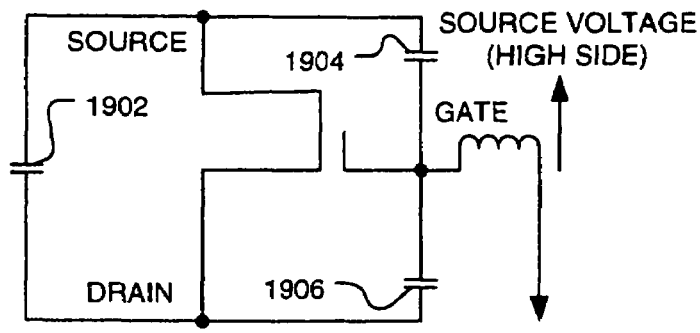
FIG. 41 is a schematic of a power supply switch of a type that can be used with at least some embodiments of the present invention.

A schematic 1900 of power supply switch MOSFETs 235, 239, 269, 279 is shown in FIG. 41. There is in each MOSFET an inherent source-to-drain capacitance 1902, an inherent gate-to-source capacitance 1904 and an inherent gate-to-drain capacitance 1906. Please note that 1902, 1904 and 1906 are not separate components, but rather hypothetical components that model the way charge behaves inside a FET. The ratio of gate-to-source capacitance to gate-to-drain capacitance is herein called the gate capacitance ratio. In a power supply switch that is high side referenced so that the gate voltage is nominally referenced to the drain voltage, the gate voltage will tend to be pulled toward the source voltage by the gate capacitance effect. The gate capacitance effect is the absolute value of the difference between the source and drain voltages multiplied by the gate capacitance ratio. The smaller the gate capacitance ratio (e.g. >0.1, >0.05), the less the gate voltage will be pulled toward the source voltage.

While making a smaller gate capacitance ratio is one way to reduce the gate capacitance effect, overbiasing the gate reference voltage is a way to systematically compensate for the gate capacitance effect. More particularly, the driving circuitry that generates the gate reference voltage preferably offsets (i.e., offsets away from the source voltage level) the gate reference voltage in an amount approximately equal to the gate capacitance effect. For example, if source is at ground level and drain is at 20 V, and the gate capacitance ratio is 0.05, then gate capacitance effect equals |20V−0V|*0.05=1 volt. Therefore, the gate reference voltage would be about 20V+1V=21 V at this point to make up for the gate capacitance effect. Overbiasing of the gate is especially helpful when multiple power supply switches and synchronous operation give rise to the possibility of phantom switching because the overbiasing helps eliminate or reduce phantom switching.

Figure 4:
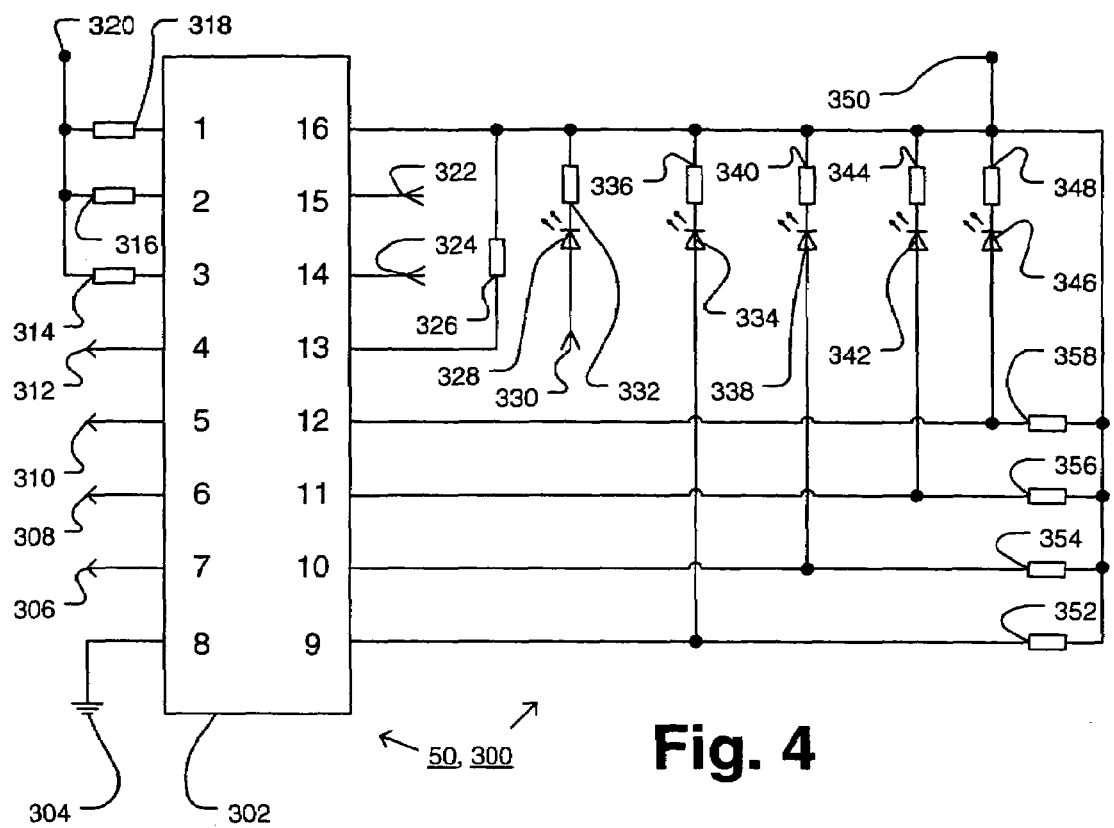
FIG. 4 is a display and equalization first portion of the first embodiment power supply.

Referring to FIG. 4, display and equalization first portion 300 includes inputs 322, 324, 330; outputs 306, 308, 310, 312; terminals 320, 350; ground (preferably digital) 304; resistors 314, 316, 318, 326, 332, 336, 340, 344, 348, 352, 354, 356, 358; light emitting diodes (LEDs) 328, 334, 338, 342, 346; and sixteen port processing circuit 302. The circuit elements of the display and equalization first portion are electrically interconnected as shown in FIG. 4. Preferred electrical characteristics for some of the elements of the display and equalization first portion are now set forth in parentheses after each element: input 322 (Serial Data Port B); input 324 (Serial Clock Port B); input 330 (LED 1); output 306 (Equalization 4); output 308 (Equalization 3); output 310 (Equalization 2); output 312 (Equalization 1); terminal 320 (+5.4V); terminal 350 (+5.4 V); resistor 314 (100K); resistor 316 (100K); resistor 318 (100K); resistor 326 (100K); resistor 332 (1K0); resistor 336 (1K0); resistor 340 (1K0); resistor 344 (1K0); resistor 348 (1K0); resistor 352 (100K); resistor 354 (100K); resistor 356 (100K); resistor 358 (100K); LED 328 (Red); LED 334 (Yellow); LED 338 (Green); LED 342 (Green); LED 346 (Green); port 1 of circuit (or "ckt") 302 (A0); port 2 of ckt 302 (A1); port 3 of ckt 302 (A2); port 4 of ckt 302 (LED0); port 5 of ckt 302 (LED1); port 6 of ckt 302 (LED2); port 7 of ckt 302 (LED3); port 8 of ckt 302 (GND); port 9 of ckt 302 (LED4); port 10 of ckt 302 (LED5); port 11 of ckt 302 (LED6); port 12 of ckt 302 (LED7); port 13 of ckt 302 (RESET); port 14 of ckt 302 (SCL); port 15 of ckt 302 (SDA); and port 16 of ckt 302 (VDD).

Processing circuit 302 is preferably structured as an 8-bit I2C LED Driver (with programmable blink rates), model PCA9551 made by Philips Semiconductors of the Netherlands. Processing circuit 302 receives signals in I2C, serial format from the main microprocessor and converts these into parallel signals, such as: (1) parallel signals used to control LEDs 328, 334, 338, 342, 346; and (2) parallel signals used to control charging equalization (further discussed below). The I2C format signal are input to processing circuit 302 through ports 14 and 15. The parallel signals for controlling the LEDs are output through processing circuit 302 ports 9 to 18. The parallel signals for controlling charging equalization are output through processing circuit 302 ports 4 to 7. One feature of the I2C to parallel communications interface of processing circuit 302 is that it separates the LED drive circuitry from direct microprocessor current. This is beneficial because the microprocessor typically makes very sensitive voltage measurements. Another feature of the I2C to parallel communications interface of processing circuit 302 is that this scheme frees up microprocessor pins because the serial I2C version of the communications, output by the microprocessor) requires fewer pins than the parallel LED-related and equalization-related versions of the same communications as output by processing circuit 302.

Figure 5:
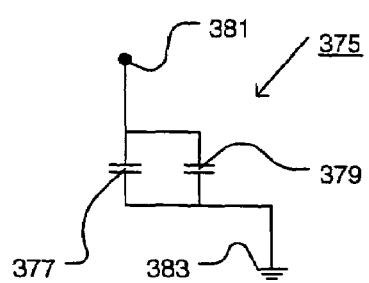
FIG. 5 is a capacitor set for use in the first embodiment power supply.

FIG. 5 shows decoupling capacitor set 375 including +5.4 V terminal 381, ground 383; 0.1 microfarad (μF) capacitor 377; and 1 μF capacitor 379. Capacitors 377 and 379 are connected in parallel. Capacitor set 375 is connected between the +5.4 supply rail and digital ground, electrically proximate to processing circuit 302. The use of both 0.1 μF and 1 μF capacitors causes decoupling at both high and low frequencies.

Figure 6:
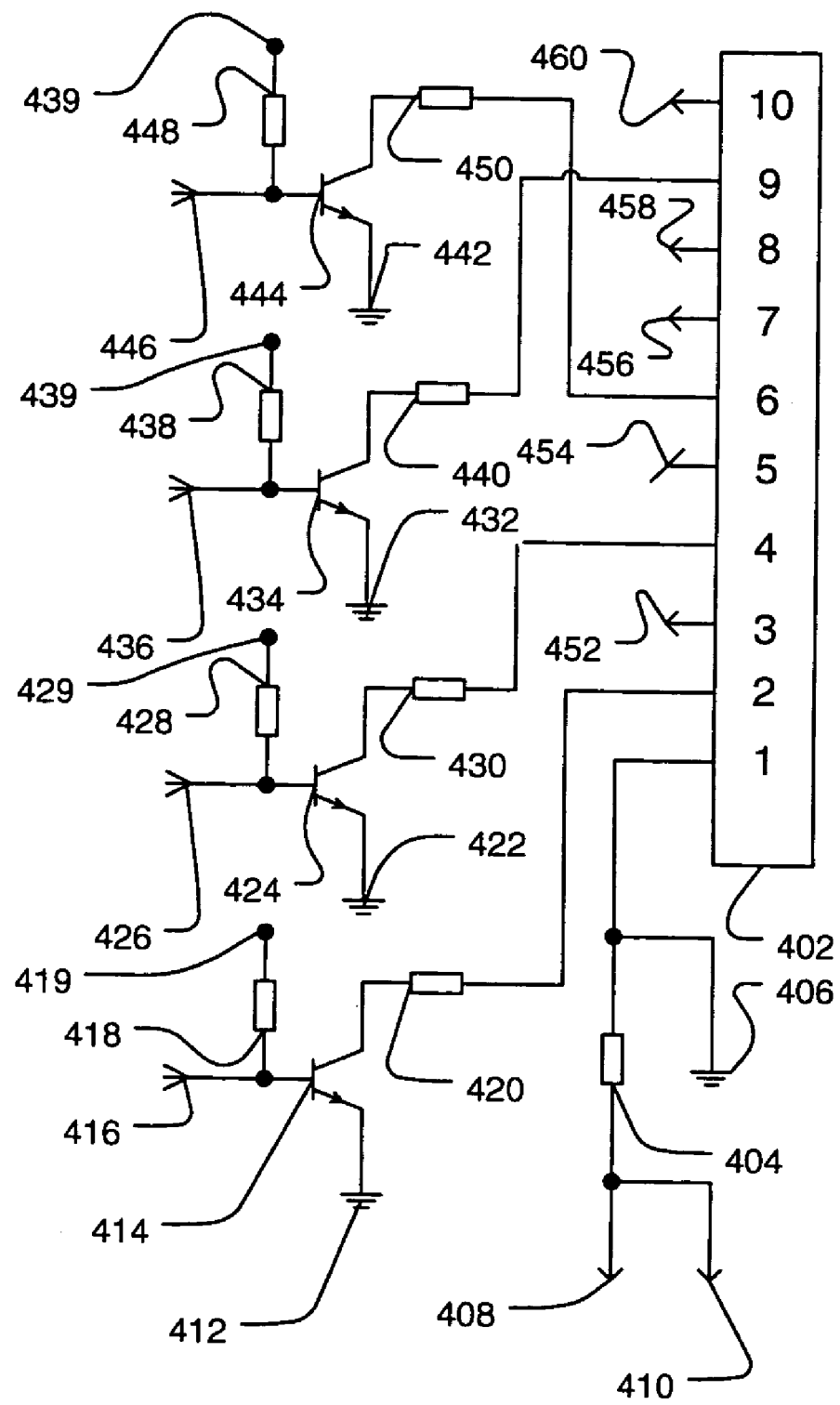
FIG. 6 is a display and equalization second portion of the first embodiment power supply.

Referring to FIG. 6, display and equalization second portion 400 includes inputs 416, 426, 436, 446; outputs 408, 410, 452, 454, 456, 458, 460; terminals 419, 429, 439, 449; grounds (preferably digital) 406, 412, 422, 432, 442; resistors 404, 418, 420, 428, 430, 438, 440, 448, 450; NPN bipolar transistors 414, 424, 434, 444; and ten port connector 402. The circuit elements of the display and equalization second portion are electrically interconnected as shown in FIG. 1b. Preferred electrical characteristics for some of the elements of the display and equalization second portion are now set forth in parentheses after each element: input 416 (Equalization 1); input 426 (Equalization 2); input 436 (Equalization 3); input 446 (Equalization 4); output 408 (Battery−); output 410 (IS+); output 452 (Cell 1); output 454 (not connected); output 456 (Battery+); output 458 (Cell 3); output 460 (Cell 2); terminal 419 (+5.4 V); terminal 429 (+5.4 V); terminal 439 (+5.4 V); terminal 449 (+5.4 V); resistor 404 (5 mOhm Cu Track); resistor 418 (301K); resistor 420 (0R); resistor 428 (301K); resistor 430 (0R); resistor 438 (301K); resistor 440 (301K); resistor 448 (301K); and resistor 450 (301K).

Connector 402 is preferably structured as a 2 by 5, 25 square header connector. The circuitry and electronics of power supply 50 are preferably mounted on a control board (not shown). The electrochemical cells charged and discharged by power supply 50 are preferably mounted on an interconnect board (or frame). Connector 402 (mounted on the control board) electrically connects the control board to the interconnect board, and to the electrochemical cells (preferably four connected in series) themselves. Transistors 414, 424, 434, 444 act as switches for equalization resistors (not shown in FIG. 6, but preferably located on the control board).

More particularly, it is preferred that the electrochemical cells charge at (at least) roughly even rates and/or at a roughly equal charged capacity over the recharging process. Therefore, an equalization resistor is selectively connected in parallel with each electrochemical cell. When an electrochemical cell is charging too quickly, the parallel bypass resistor can be turned on by the corresponding transistor 414, 424, 434, 444. If an electrochemical cell is charging too slowly then its bypass resistor can be disconnected by turning off the corresponding transistor switch. As mentioned previously, the parallel format equalization signals EQ1, EQ2, EQ3, EQ4 to control the on-off state of the transistors is received from processing circuit 302 based on I2C signals from the microprocessor. In this way, the microprocessor controls cell charging rates and/or relative charged capacities. It is noted that in other embodiments, other types of charging control may be desired (e.g., preferentially charge/discharge one of the cells relative to the others). The above-discussed control signals and transistors 414, 424, 434, 444 also provide a mechanism to effect these other, non-preferred types of control.

Figure 7:
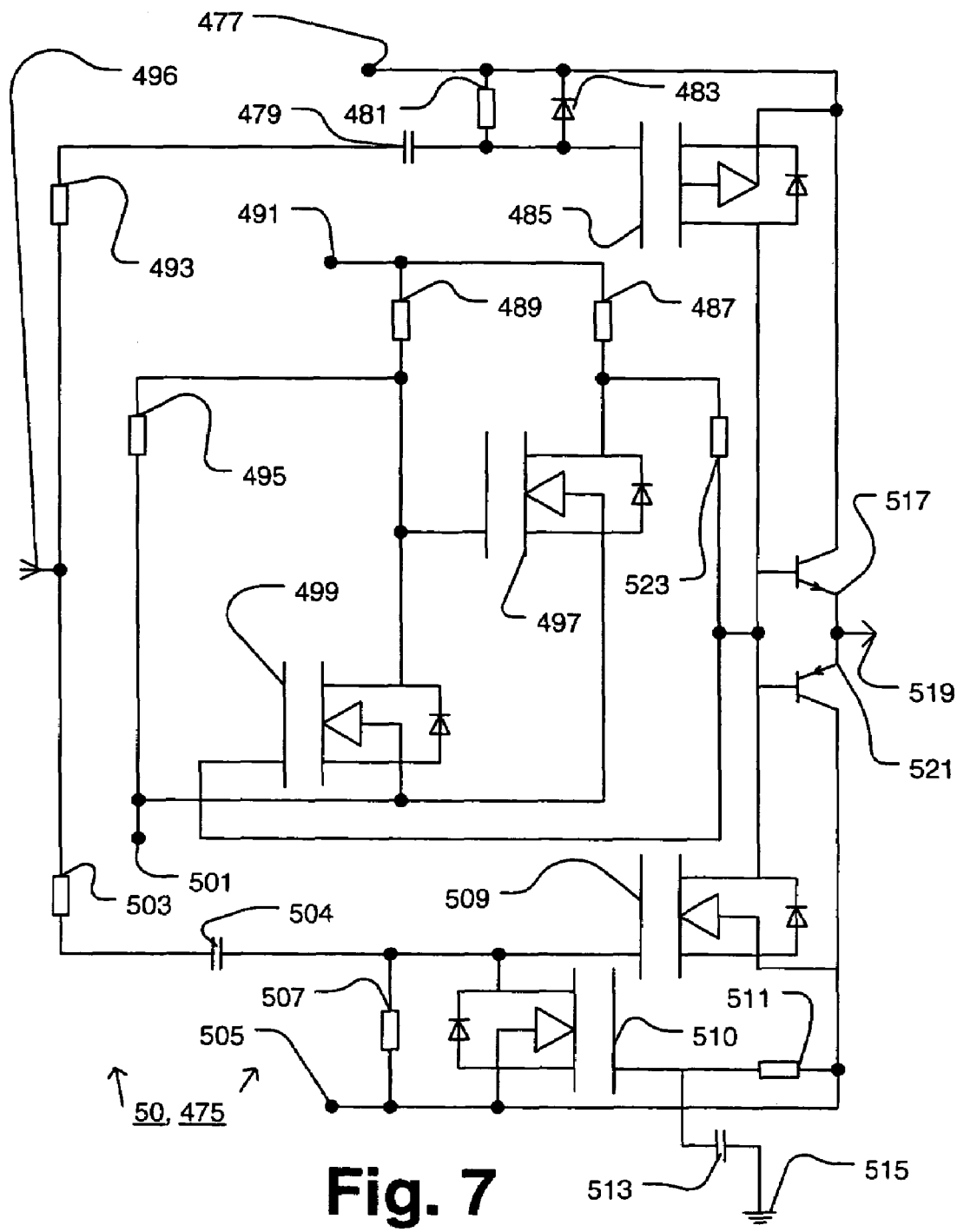
FIG. 7 is a first field effect transistor (FET) driver of the first embodiment power supply.

Four FET driver circuits 475, 525, 575, 625 will now be explained with reference to FIGS. 7, 8, 9 and 10, respectively. Referring to FIG. 7, first FET driver 475 includes input 496; output 519; ground (preferably analog) 515; resistors 481, 487, 489, 493, 495, 503, 507, 511, 523; capacitors 479, 513; terminals 477, 491, 501, 505; diode 483; bipolar transistors 517, 521; and FETs 485, 497, 499, 509, 510. Preferred electrical characteristics for some of the elements of first FET driver 475 are set forth in parentheses in the following list: input 496 (Seriesa_In); output 519 (Seriesa_Gate); resistor 481 (4K99); resistor 487 (301K); resistor 489 (100K); resistor 493 (24R9); resistor 495 (301K); resistor 503 (24R9); resistor 507 (4K99); resistor 511 (100K); resistor 523 (100K); capacitor 479 (1000 pF); capacitor 513 (0.01 µF); terminal 477 (V1+); terminal 491 (V1+); terminal 501 (V1−); and terminal 505 (V1−). Diode 483 is preferably model number BAV70 (see webpage http://www.fairchildsemi.com/cqpf/BA/BAV70.html for further information on component BAV70). Bipolar transistor 517 is preferably model number FMMT619CT. Bipolar transistor 521 is preferably model number FMMT720CT.

Figure 8:
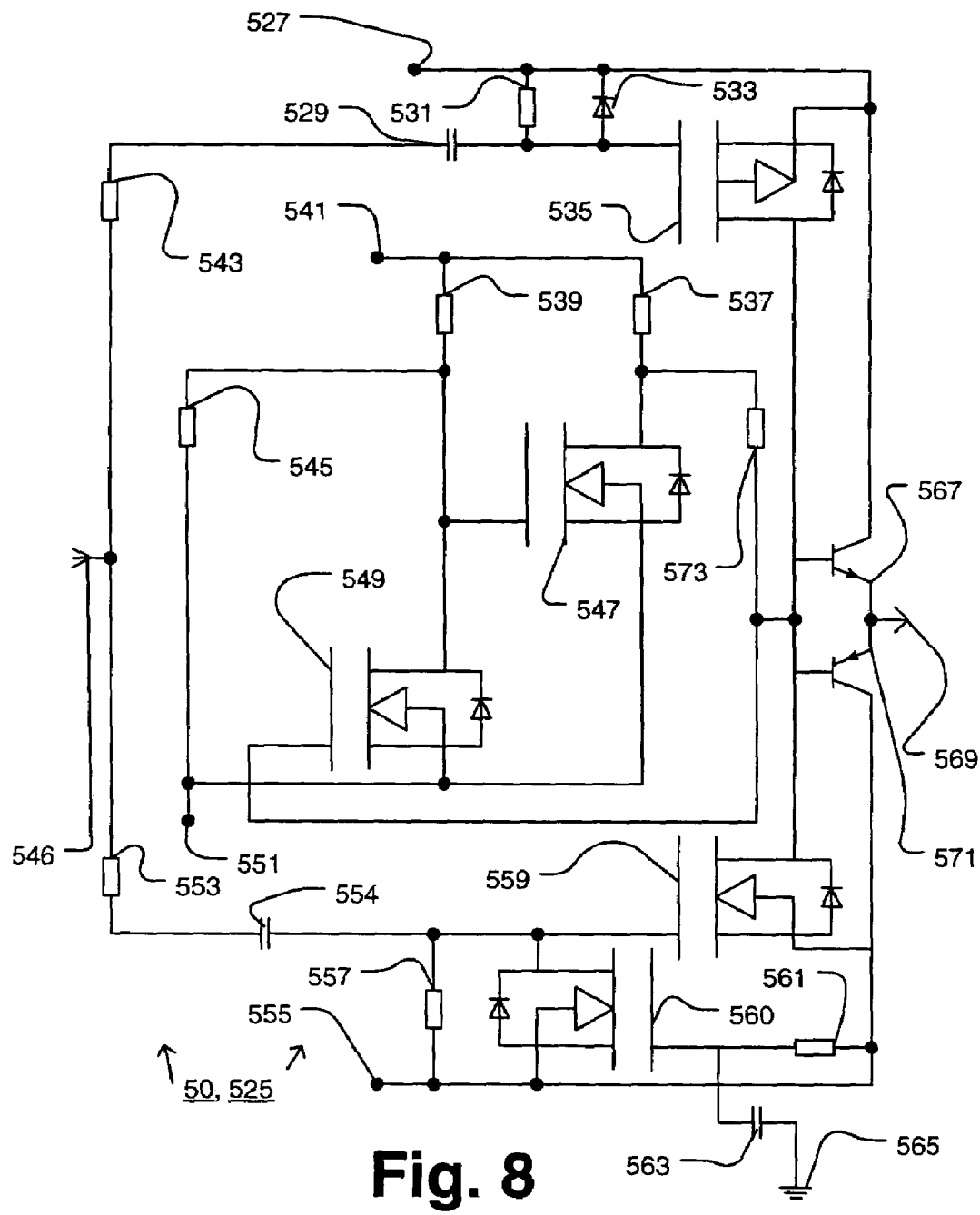
FIG. 8 is a second field effect transistor (FET) driver of the first embodiment power supply.

Referring to FIG. 8, second FET driver 525 includes input 546; output 569; ground (preferably analog) 565; resistors 531, 537, 539, 543, 545, 553, 557, 561, 573; capacitors 554, 529, 563; terminals 527, 541, 551, 555; diode 533; bipolar transistors 567, 571; and FETs 535, 547, 549, 559, 560. Preferred electrical characteristics for some of the elements of second FET driver 525 are set forth in parentheses in the following list: input 546 (Seriesb_In); output 569 (Seriesb_Gate); resistor 531 (4K99); resistor 537 (301K); resistor 539 (100K); resistor 543 (24R9); resistor 545 (301K); resistor 553 (24R9); resistor 557 (4K99); resistor 561 (100K); resistor 573 (100K); capacitor 554 (1000 pF); capacitor 529 (1000 pF); capacitor 563 (0.01 µF); terminal 527 (V3+); terminal 541 (V3+); terminal 551 (V3−); and terminal 555 (V3−). Diode 533 is preferably model number BAV70. Bipolar transistor 567 is preferably model number FMMT619CT. Bipolar transistor 571 is preferably model number FMMT720CT.

Figure 9:
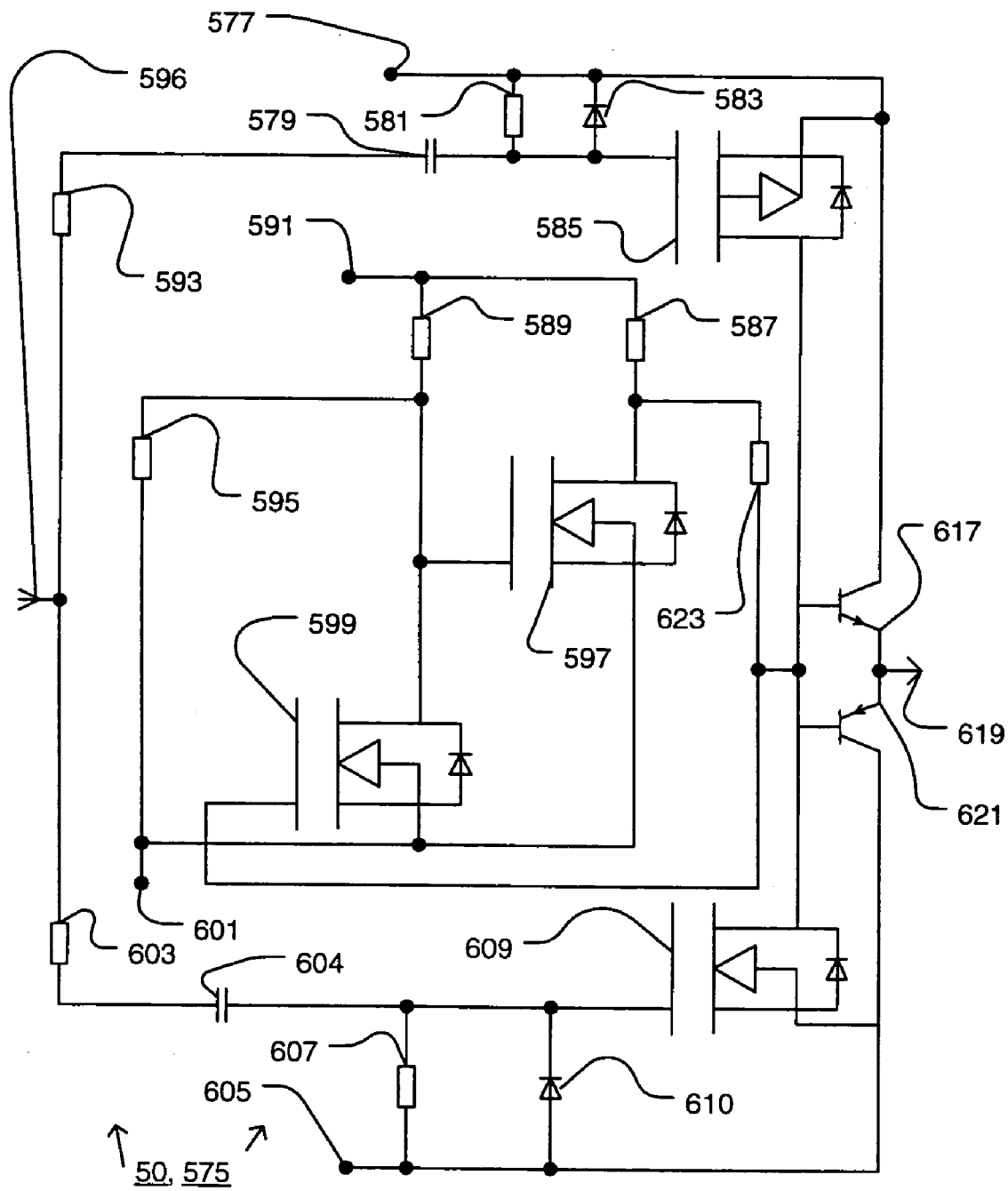
FIG. 9 is a third field effect transistor (FET) driver of the first embodiment power supply.

Referring to FIG. 9, third FET driver 575 includes input 596; output 619; resistors 581, 587, 589, 593, 595, 603, 607, 623; capacitors 604, 579; terminals 577, 591, 601, 605; diodes 583, 610; bipolar transistors 617, 621; and FETs 585, 597, 599, 609. Preferred electrical characteristics for some of the elements of third FET driver 575 are set forth in parentheses in the following list: input 596 (Shunta_In); output 619 (Shunta_Gate); resistor 581 (4K99); resistor 587 (301K); resistor 589 (301K); resistor 593 (24R9); resistor 595 (DNP); resistor 603 (24R9); resistor 607 (4K99); resistor 623 (100K); capacitor 604 (1000 pF); capacitor 579 (1000 pF); terminal 577 (V2+); terminal 591 (V2+); terminal 601 (V2−); and terminal 605 (V2−). Diodes 583, 610 are preferably model number BAV70. Bipolar transistor 617 is preferably model number FMMT619CT. Bipolar transistor 621 is preferably model number FMMT720CT.

Figure 10:
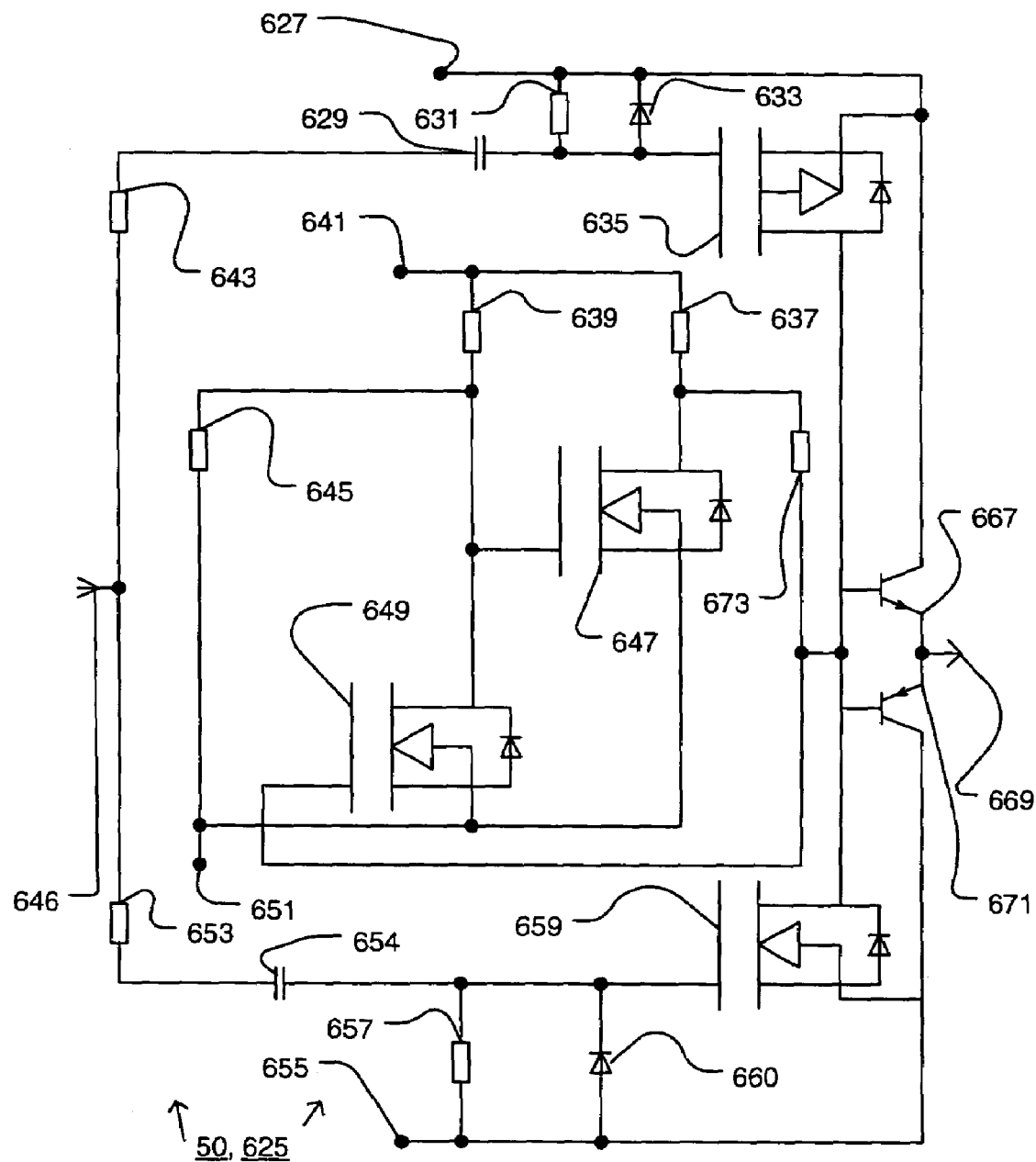
FIG. 10 a fourth field effect transistor (FET) driver of the first embodiment power supply.

Referring to FIG. 10, fourth FET driver 625 includes input 646; output 669; resistors 631, 637, 639, 643, 645, 653, 657, 673; capacitors 654, 629; terminals 627, 641, 651, 655; diodes 633, 660; bipolar transistors 667, 671; and FETs 635, 647, 649, 659. Preferred electrical characteristics for some of the elements of fourth FET driver 625 are set forth in parentheses in the following list: input 646 (Shuntb_In); output 669 (Shuntb_Gate); resistor 631 (4K99); resistor 637 (301K); resistor 639 (301K); resistor 643 (24R9); resistor 645 (DNP); resistor 653 (24R9); resistor 657 (4K99); resistor 673 (100K); capacitor 654 (1000 pF); capacitor 629 (1000 pF); terminal 627 (V2+); terminal 641 (V2+); terminal 651 (V2−); and terminal 655 (V2−). Diodes 633, 660 are preferably model number BAV70. Bipolar transistor 667 is preferably model number FMMT619CT. Bipolar transistor 671 is preferably model number FMMT720CT.

The four FET drivers 475, 525, 575, 625 respectively handle control signals for the four power supply switches, specifically MOSFETS 235, 269, 239, 279 (see FIG. 3b and related discussion). The operation of each of the four FET drivers is quite similar, so only the operation of FET driver 475 will be discussed now in detail. FET driver 475 handles control output signals, that is, the signals sent from the controller to a power supply switch (in this example, MOSFET 235) to control the on-off operation of that power supply switch. More particularly, the some features of FET driver 475 relate to: (1) a capacitive coupling in the path transmitting the control output signal; (2) use of a pinkeeper circuitry in the path transmitting the control output signal; and/or (3) use of a path suitable for draining gate capacitance charge from a power supply switch. It should be kept in mind that at least some of the features explained in this context will have applicability to other switching power supplies (now extant and to be developed in the future) having various hardware layouts, topologies, etc.

This conversion of the control output signals from one form to another by FET driver 475 will now be explained. Specifically, the conversion of the Seriesa_In control output signal 496 into the form of the corresponding Seriesa_Gate control output signal 519 will be explained with reference to FIG. 7. FET driver 475 may be more generically referred to as a power supply switch driver. As shown in FIG. 7, the Seriesa_In signal 496 (from the controller) is provided as an input at the left side of FET driver 475. FET driver 475 converts the Seriesa_In signal into the corresponding Seriesa_Gate signal 519, which is provided as an output on the right side of FET driver 475. Three aspects of FET driver 475 will now be discussed: (1) capacitive coupling; (2) pinkeeper; and (3) path suitable for draining gate capacitance charge from a power supply switch.

FET driver 475 includes capacitors 479, 504. These two capacitors form a capacitive coupling (alternatively, there could be more or fewer individual capacitors in the capacitive coupling). More particularly, there is no direct (or dc) path between the Seriesa_In input 496 and the Seriesa_Gate output 519. Communication of the control output signal therefore goes through this capacitive coupling.

In the preferred embodiment, the Seriesa_In signal is in the form of a 5 volt, digital ground referenced square wave (e.g., 0 volts for off, 5 V for on). Most of the time, during the flat stay-off or stay-on portions, this Seriesa_In square wave signal has only a dc component. This dc component does not get communicated through the capacitive coupling. However, the rising and falling of the square wave involve high frequency components, as would be revealed by a Fast Fourier Transform. These high frequency components, these rising or falling edges, are communicated through the capacitive coupling. Specifically, the rising and falling edges cause short duration positive and negative voltage spikes on the right side of FET driver 475.

Therefore, in this preferred embodiment, wherein a square wave format control output signal is communicated through a capacitive coupling to become a signal characterized by voltage spikes (herein called an intermediate control output signal because it is an intermediate form of the control output signal between the Seriesa_In form and the Seriesa_Gate form). However, it is noted that alternative embodiments may use other electrical signal patterns, while still effecting communication through a capacitive coupling. For example, the control output signal could be in the form of voltage spikes prior to being communicated by the capacitive coupling. At least in theory, any control output signal with a substantial high frequency component can be communicated through a capacitive coupling in some fashion.

At least theoretically, the intermediate control output signal could directly be used to control a power supply switch. Of course, the power supply switch would need to be designed to be turned on or off (and quickly so) by positive and negative voltage spikes. Such an embodiment of the present invention would potentially have many of the advantages of capacitive coupling, as will be explained below. However, in power supply 50, the power supply switches are constructed as FETs 235, 269, 239, 279, which are referenced at around the relatively high voltages of electrochemical cells (e.g., 10V to 20V). The voltage spikes of the intermediate signal are insufficient to directly control the FET power supply switches of preferred embodiment 50 for reasons including the following: (1) the amplitude (that is, absolute voltage level) of the spikes are too low to operate the power supply switch FET (which is operating at battery voltage type levels); and (2) the spikes have a short time duration, while the gate terminal of the power supply switch FET must be driven by a continuous voltage.

In order to make the spike-form intermediate control output signal control the power supply switch 235, the intermediate control output signal is converted into the Seriesa_Gate signal 519 by the pinkeeper circuitry included in FET driver 475. The pinkeeper circuitry includes FETs, bipolar transistors and resistors as shown in FIG. 7. The principles of operation of the pinkeeper circuitry are conventional and will therefore not now be discussed in component by component detail here. For present purposes, the hardware details of the pinkeeper circuitry isn't as important as the idea of using pinkeeper circuitry in conjunction with a control output signal for a power supply switch set in a switching power supply.

Generally speaking, the pinkeeper circuitry of FET driver 475 uses the positive and negative voltage spikes of the intermediate control output signal to latch the Seriesa_Gate control output signal at a high or a low level. The voltage values for the high and low levels will depend upon battery voltage, power supply FET switch polarity, overbiasing and so on. The FET driver circuitry is typically where the overbiasing of the gate reference voltage to compensate for gate capacitance effect is applied to the driver signal. The latched Seriesa_Gate signal is applied to the gate terminal of the series a power supply FET switch 235. When Seriesa_Gate is latched in one voltage state (say, low voltage level), this turns and maintains the power supply FET switch off. When Seriesa_Gate is latched in the other voltage state (say, high voltage level), this turns and maintains the power supply FET switch on. The pinkeeper circuitry is bi-stable. That is, the pinkeeper circuitry reliably maintains Seriesa_Gate in a high or low (that is, on or off) state, changing only in response to spikes in the intermediate control output signal.

Now that the operation of the capacitive coupling and the pinkeeper circuitry have been discussed, discussion will move to the path suitable for draining gate capacitance charge from a power supply switch, built into FET driver 475. Assume that a step change in the voltage of the Seriesa_In control output signal causes a voltage spike in the intermediate control output signal. This spike turns on FET 509 (see FIG. 7). Turning on FET 509 causes current to be pulled through bipolar transistor 521. Pulling current through bipolar resistor 521 pulls the Seriesa_Gate control output signal down toward voltage level V1−. When the Seriesa_Gate signal reaches voltage V1− it will turn the Seriesa_power supply FET switch 235 on or off (depending on polarity of the series a power supply FET switch). In this electrical scheme, FET 509 is a low impedance path. This current drain quickly drains the gate capacitance of the series a power supply FET switch.

Because the gate capacitance is quickly drained, the Series_a power supply FET switch 509 turns on and off quickly. Also, any overbiasing of the gate capacitance will be accomplished more quickly because of the low impedance current path. This quick on-off operation of the power supply FET switch 509 reduces switching losses and/or transition losses and thereby improves efficiency. For example, a rise time as low as 10 nanoseconds has been observed. That is very quick.

The capacitive coupling, pinkeeper and current path features embodied in conversion circuitry 202 (whether considered individually or in combination) has several potential objectives, features and/or advantages:

(1) Control output signal can be generated at one reference level by the controller circuitry (e.g., digital ground referenced), but can still control a power supply switch referenced at a different level (e.g., power supply FET switch referenced at the analog voltage of an electrochemical cell); the feature of having two (or more) different reference levels for a control output signal is facilitated by the capacitive coupling;

(2) Control output signal can be generated at one voltage amplitude level by the controller circuitry (e.g., 5 V over digital ground for on), but can still control a power supply switch responsive to a different level control signal (e.g., power supply FET switch operated with overbiasing); the feature of having two (or more) different amplitude levels for a control output signal is facilitated by the capacitive coupling;

(3) The control output signal generated by the controller does not need to actively and/or continuously drive the power supply switch; this feature is facilitated by the pinkeeper and its latching;

(4) Switching losses and associated rise and fall times associated with the switching of a power supply switch are reduced; this is facilitated by the capacitive coupling; for example, the capacitive coupling facilitates a reduction in switching losses in the sense that the control output signal reference level and amplitude level can be manipulated by virtue of the capacitive coupling so that faster power supply switch driver components can be chosen and/or so that power supply switch driver components can be operated well below their voltage and/or speed limitations;

(5) Switching losses and associated rise and fall times associated with the switching of a power supply switch are reduced; this is facilitated by the low impedance path and/or appropriate capacitors for alternately draining and supplying charge of the gate capacitance of the power supply switch (e.g., FET switch);

(6) Allows quicker and/or a more accurate overbiasing of power supply switch (e.g., power supply FET switch);

(7) Prevents phantom switching;

(8) Improves power supply efficiency and reduces heat generated in power supply switch (e.g., FET switch) during rides and falls of the operative control output signal;

(9) Bipolar transistor used to help form a low impedance path for gate capacitance of a power supply switch; and

(10) use of what is effectively a high gain current amplifier.

FIGS. 11 to 14 show capacitor sets 800, 825, 850, 875 respectively used in conjunction with FET drivers 235, 239, 269, 279. The capacitor sets 800, 825, 850, 875 absorb the gate capacitance of a corresponding power supply FET switch 235, 239, 269, 279 when it is turned off. The capacitor sets also supply charge to help restore the gate capacitance when the corresponding power supply FET switch is turned on again. For example, capacitor set 800 is connected across the V1+/V1− terminals of FET driver 475 and exchanges charge with the Seriesa power supply FET switch 235. FIG. 11 shows capacitor set 800 including V1+ terminal 802, V1− terminal 808, Charge Supply input 814, 0.1 µF capacitors 804, 808 and 0.01 µF capacitors 810, 812. FIG. 12 shows capacitor set 825 including V2+ terminal 827, V2− terminal 833, ground 837, 0.1 µF capacitors 829, 831 and 0.01 µF capacitors 835, 839. FIG. 13 shows capacitor set 850 including V2+ terminal 852, V2− terminal 858, ground 862, 0.1 µF capacitors 854, 856 and 0.01 µF capacitors 860, 864. FIG. 14 shows capacitor set 875 including V3+ terminal 877, V3− terminal 883, Battery+ input 887, 0.1 µF capacitors 879, 881 and 0.01 µF capacitors 885, 889.

FIG. 15 shows Batt− input 895 and ground 897. The circuitry of FIG. 15 connects the Batt− signal to a (preferably analog) ground.

The circuitry of FIGS. 16 to 19 will now be explained by first identifying the constituent components in each of the Figs., followed by discussion of the operation of the circuitry and its role in switching power supply 50.

Figure 16:
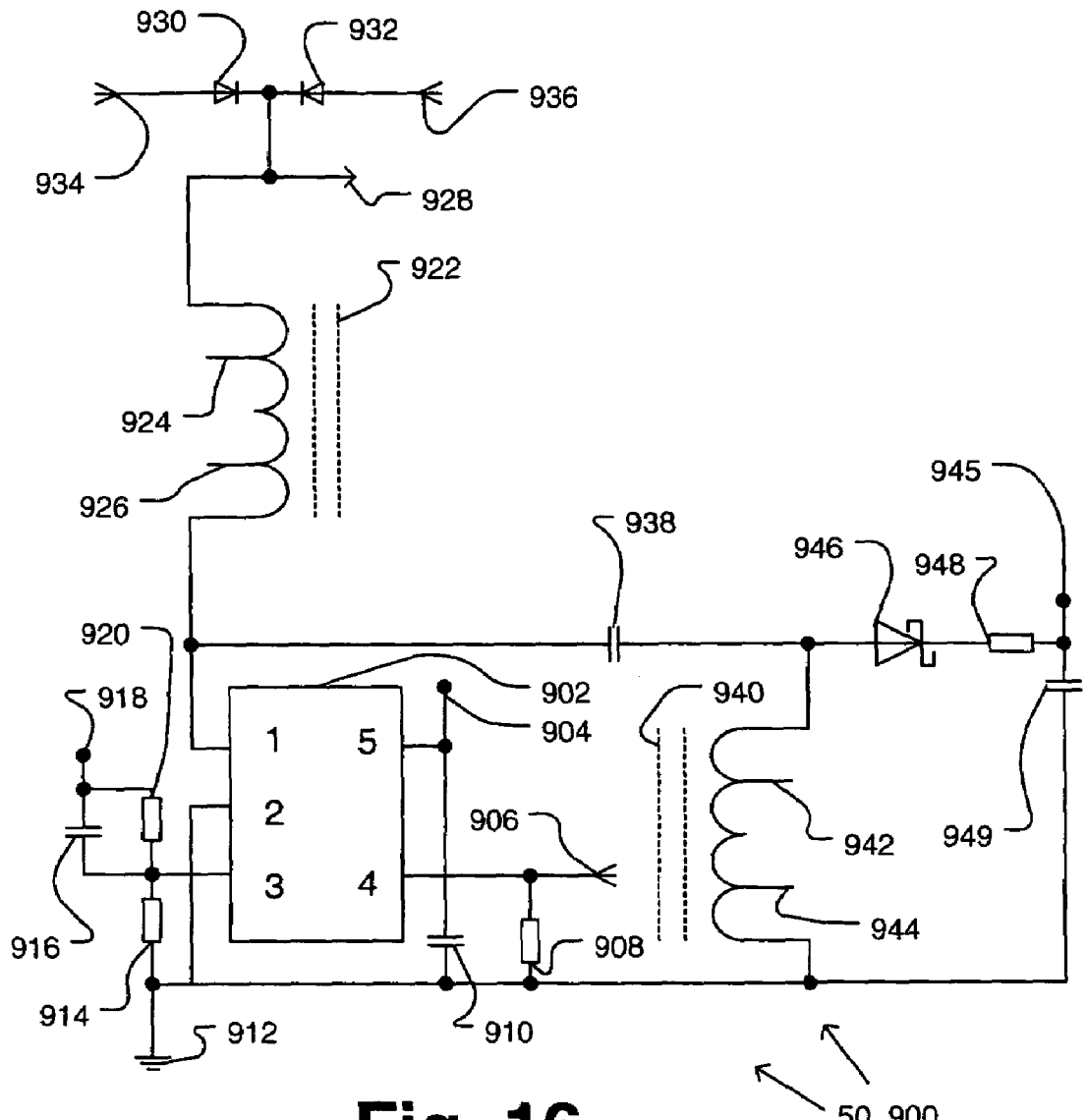
FIG. 16 is an isolated power supply transformer circuitry of the first embodiment power supply.

Referring to FIG. 16, isolated power supply transformer circuitry 900 includes inputs 906, 934, 936; output 928; terminals 904, 918, 945; ground (preferably digital) 912; resistors 908, 914, 920, 948; capacitors 910, 916, 938, 949; core/winding assemblies 922, 940; diodes 930, 932; Schottky diode 946; and switch mode regulator 902. The circuit elements of the isolated power supply transformer circuitry are electrically interconnected as shown in FIG. 16. Preferred electrical characteristics for some of the elements of isolated power supply transformer circuitry 900 are set forth in parentheses in the following list: input 906 (Power_Enable); input 934 (Batt+); input 936 (Charge_Supply); output 928 (Control_Power); terminal 904 (+4.7 V); terminal 918 (+5.4 V_; terminal 945 (+5.4 V); resistor 908 (100K); resistor 914 (10K0); resistor 920 (33K2); resistor 948 (10R0); capacitor 910 (10 µF); capacitor 916 (4.7 pF); capacitor 938 (1 µF); capacitor 949 (10 µF); port 1 of regulator 902 (SW); port 2 of regulator 902 (GND); port 3 of regulator 902 (FB); port 4 of regulator 902 (VIN); and port 5 of regulator 902 (SHDN). Diode 930, 932 are preferably model number BAV70. Schottky diode 946 is preferably model number MA112CT. Core/winding assembly 922 is preferably model number T1A F4E1810B+F4IE1810B. Core/winding assembly 940 is preferably model number T1E. Core/winding assemblies 922 and 940 include taps 924, 926, 942, 944, which taps will be further discussed below.

Figure 17:
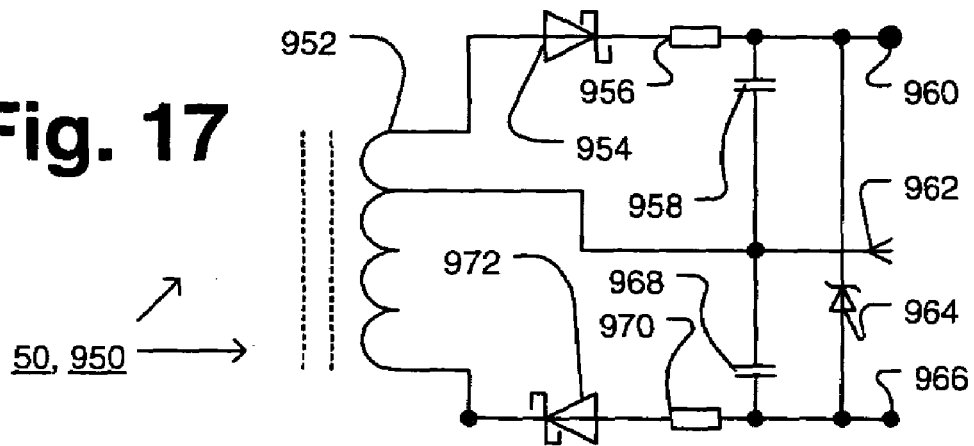
FIG. 17 is a first tap circuitry of the first embodiment power supply.

Referring to FIG. 17, first tap circuitry 950 includes input 962; Schottky diodes 954, 972; terminals 960, 966; resistors 956, 970; Zener diode 964; capacitors 958, 968 and core/winding assembly 952. The circuit elements of the first tap circuitry are electrically interconnected as shown in FIG. 17. Preferred electrical characteristics for some of the elements of first tap circuitry 950 are set forth in parentheses in the following list: input 962 (Charge Supply); terminal 960 (V1+); terminal 966 (V1−); resistor 956 (10R0); resistor 970 (10R0); capacitor 958 (1 µF); and capacitor 968 (1 µF). Schottky diodes 954, 972 are preferably model number MA112CT. Zener diode 964 is preferably model number BZX84C10-7. Further information on this component can be found at webpage:

http://www.allamerican.com/direct/
product.asp?T_PRDKEY=DIO+
BZX84C107++++++++++++&T_MFGCOD=DIO+
&T_PRDID=BZX84C10-7++++++++++++.

Core/winding assembly 952 will be further discussed below.

Figure 18:
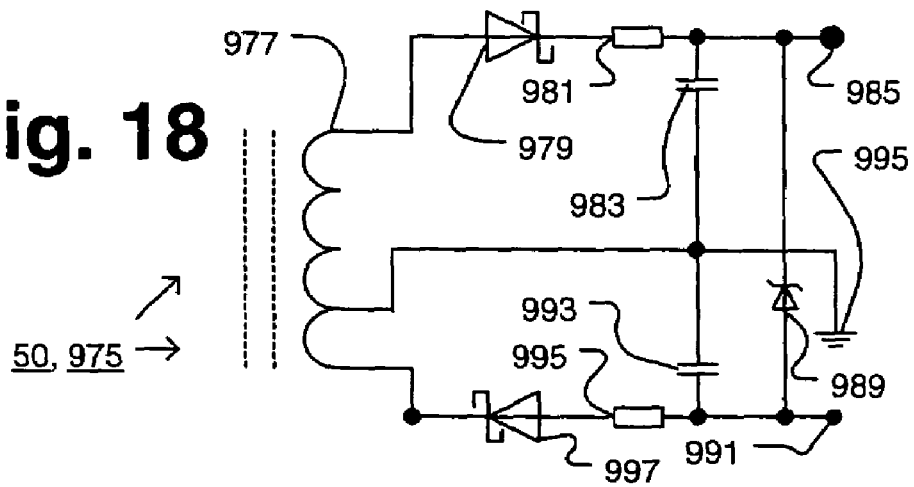
FIG. 18 is a second tap circuitry of the first embodiment power supply.

Referring to FIG. 18, second tap circuitry 975 includes circuit elements 979, 981, 983, 989, 993, 995, 997 which are similar to their counterparts in circuitry 950 identified above in connection with FIG. 17. The second tap circuitry further includes V2+ terminal 985, V2− terminal 991 and (preferably analog) ground 995. The circuit elements of the second tap circuitry are electrically interconnected as shown in FIG. 18. Core/winding assembly 977 will be further discussed below.

Figure 19:
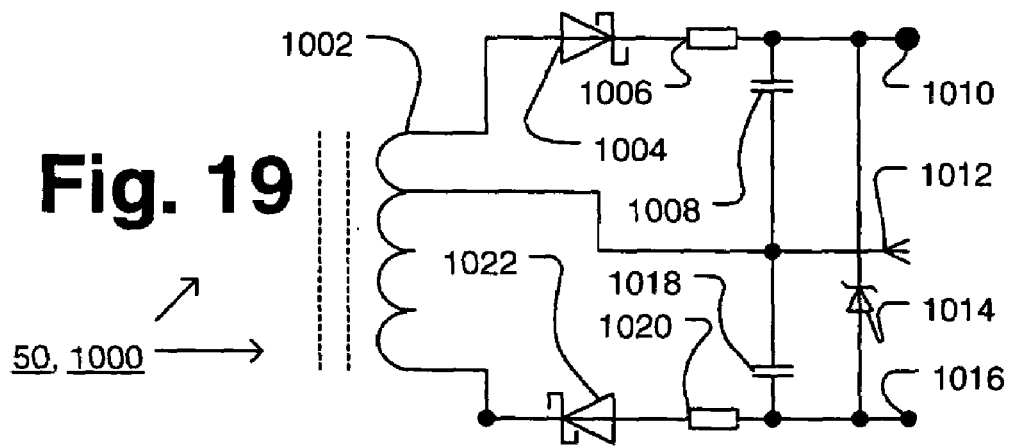
FIG. 19 is a third tap circuitry of the first embodiment power supply.

Referring to FIG. 19, third tap circuitry 1000 includes circuit elements 1004, 1006, 1008, 1014, 1018, 1020, 1022 which are similar to their counterparts in circuitry 950 discussed above in connection with FIG. 17. The third tap circuitry further includes V3+ terminal 1010, V3− terminal 1016 and Battery+ input 1012. The circuit elements of the third tap circuitry are electrically interconnected as shown in FIG. 19. Core/winding assembly 1002 will be further discussed below.

Now that the isolated power supply circuitry 900, 950, 975, 1000 has been identified, its functionality will be discussed. The isolated power supply circuitry receives input electrical, which it converts into power signals of six voltage levels: V1+, V1−, V2+, V2−, V3+ and V3−. These six voltages are used to provide bias voltages and otherwise drive the power supply switches of power supply 50, specifically MOSFETs 235, 239, 245, 269 and 279 (see FIGS. 3a and 3b).

More particularly, input 906 is a digital power enable signal that controls the on or off status of MOSFETs 235, 239, 245, 269, 279. Input 934 is Batt+, the power from the series connected string of electrochemical cells downstream of power supply 50. Input 932 Charge_Supply, is the power from the i/o jack. Diodes 930 and 932 effectively select whether Batt+ power or Charge_Supply power is used in the isolated power supply circuitry. Output 928 sends some of the electrical power to the microprocessor as Control_Power (see FIG. 22 at input 1171).

The electrical power from Batt+ 930 and/or Charge_Supply 936 is transformed into the six voltage levels by core/winding assemblies 922, 940, 952, 977 and 1002. These five core/winding assemblies utilize coils built into the board (not shown) that physically supports the various components of power supply 50. All five coils are adjacent to a common core. As will be understood by those of skill in the art, the electromagnetic interaction at the five core/winding assemblies, working in conjunction with the other components of FIGS.

16-19, transforms the power from Batt+ and/or Charge_Supply into the six voltage signals respectively at terminals 960, 966, 985, 991, 1010, 1016.

The core/winding assemblies of FIGS. 16 to 19 means that the six voltage signals V1+/−, V2+/−, V3+/− are not necessarily referenced to the voltage level of the Batt+ and Charge_Supply power inputs. Rather: (1) V1+/− signals happen to be referenced to Charge_Supply (because Charge_Supply is provided at input 962, not because of the use of Charge_Supply as input power); (2) V2+/− signals are referenced to an AC high frequency ground; and (3) V3+/− signals happen to be referenced to Batt+ (because Batt+ is provided at input 962, not because of the use of Batt+ as input power). This carefully controlled reference voltage level for the six voltage signals is important because these six signals operate and bias MOSFETs 235, 239, 245, 269, 279. As will be understood by those of skill in the art upon a review of FIGS. 3a and 3b, each of the MOSFETs must be referenced to the appropriate level (Charge_Supply, high frequency ground, Batt+) regardless of whether the power supplied through isolated power supply circuitry 900, 950, 975, 1000 comes from Charge_Supply or from Batt+ at any given point of time.

In this exemplary embodiment of power supply 50, isolated power supply circuitry 900, 950, 975, 1000 has a SEPIC configuration (see capacitor 938 at FIG. 16). Alternatively, flyback or other configurations, now known or to be developed in the future, could be used in the isolated power supply circuitry, but SEPIC will often be the most energy efficient configuration.

The microcontroller circuitry 1025, 1100, 1125 of FIGS. 20 to 22 will now be explained by first identifying the constituent components in each of the Figs., followed by discussion of the operation of the microcontroller circuitry and its role in switching power supply 50. Microcontroller circuitry first portion 1025 includes analog circuitry connected to ports 1-3, 20-23, 25, 27 and 28 of 28-port microcontroller 1027. Microcontroller circuitry second portion 1100 includes analog circuitry connected to ports 24 and 26 of 28-port microcontroller 1027. Microcontroller circuitry third portion 1125 includes digital circuitry connected to ports 4-19 of 28-port microcontroller 1027.

Figure 20:
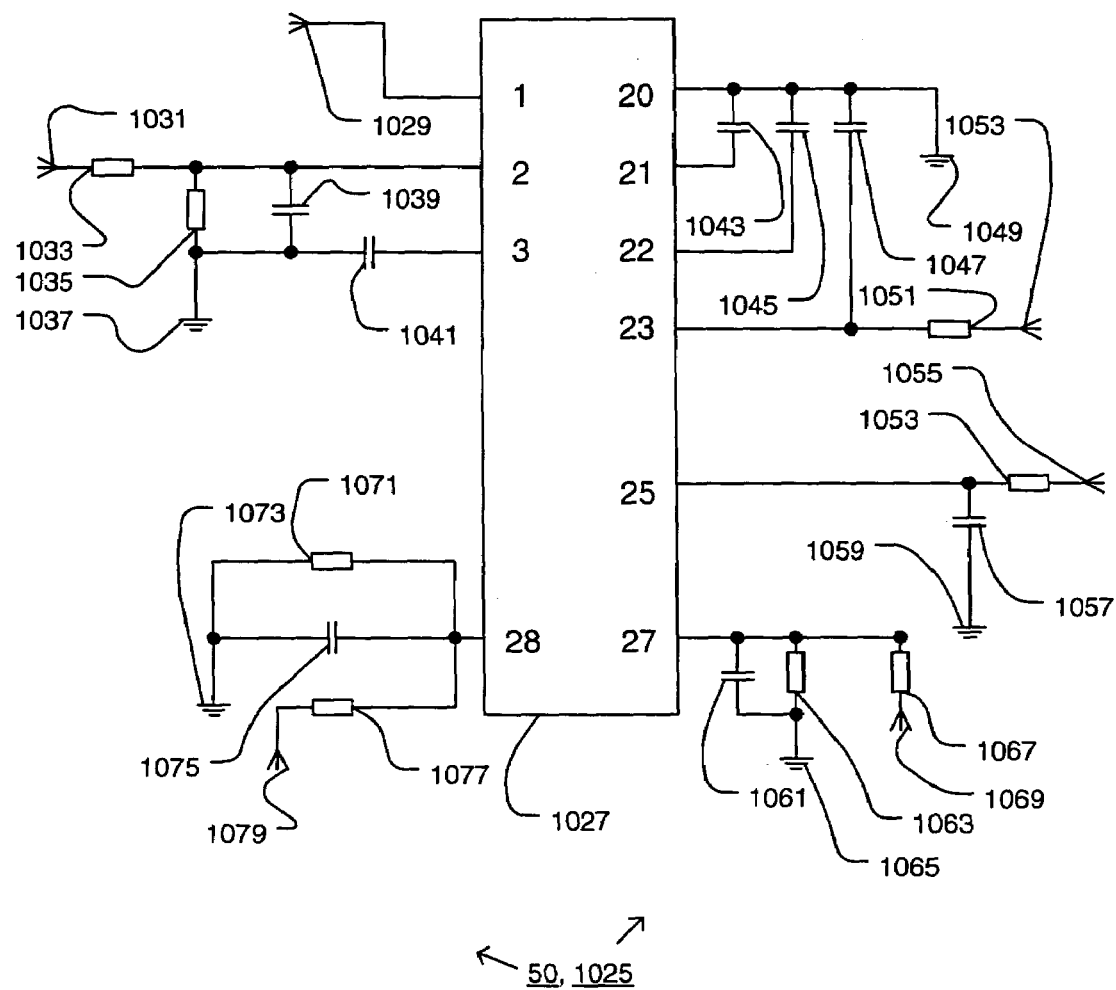
FIG. 20 is a microcontroller circuitry first portion of the first embodiment power supply.

Referring to FIG. 20, microcontroller circuitry first portion 1025 includes inputs 1029, 1031, 1053, 1055, 1069, 1079; ground (analog or digital as appropriate) 1037, 1049, 1059, 1065, 1073; resistors 1033, 1035, 1051, 1053, 1063, 1067, 1071, 1077; capacitors 1039, 1041, 1043, 1045, 1047, 1057, 1061, 1075; and 28-port microcontroller 1027. The circuit elements of the microcontroller_circuitry first portion are electrically interconnected as shown in FIG. 20. Preferred electrical characteristics for some of the elements of microcontroller circuitry first portion 1025 are set forth in parentheses in the following list: input 1029 (IS+); input 1031 (Cell_1); input 1053 (Ireg_monitor); input 1055 (IS+); input 1069 (Cell_3); input 1079 (Cell_2); resistor 1033 (301K); resistor 1035 (301K); resistor 1051 (143K); resistor 1053 (121R); resistor 1063 (143K); resistor 1067 (1M0); resistor 1071 (150K); resistor 1077 (453K); capacitor 1039 (1 μF); capacitor 1041 (1 μF); capacitor 1043 (1 μF); capacitor 1045 (0.47 μF); capacitor 1047 (1 μF); capacitor 1057 (0.47 μF); capacitor 1061 (1 μF); capacitor 1075 (1 μF); microcontroller port 1 (RA1AN1); microcontroller port 2 (RA0/AN0); microcontroller port 3 (RD3/REFB); microcontroller port 20 (Vss); microcontroller port 21 (SUM); microcontroller port 22 (CDAC); microcontroller port 23 (RD7/AN7); microcontroller port 25 (RD5/AN5); microcontroller port 27 (RA3AN3); and microcontroller port 28 (RA2AN2).

Figure 21:
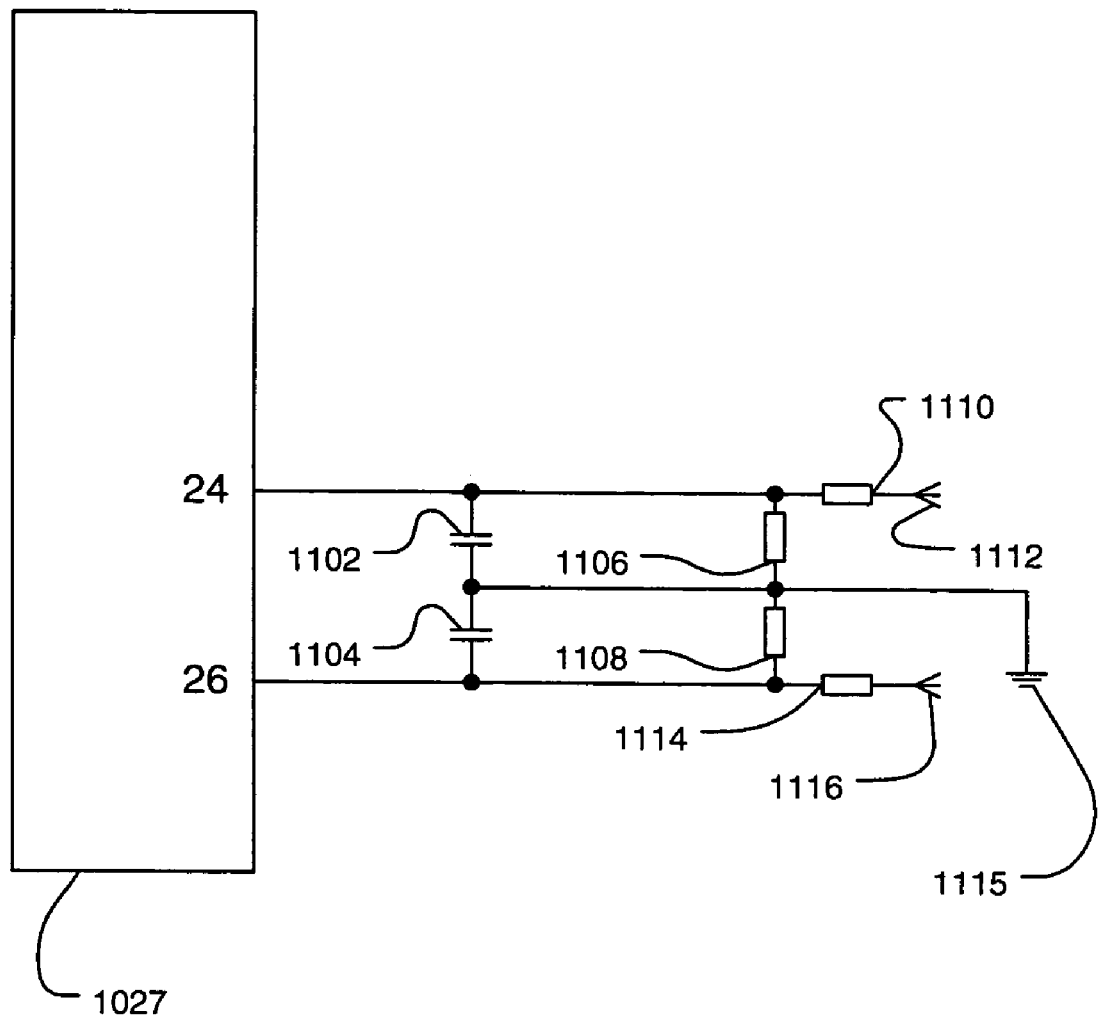
FIG. 21 is a microcontroller circuitry second portion of the first embodiment power supply.

Referring to FIG. 21, microcontroller circuitry second portion 1100 includes inputs 1112, 1116; ground (preferably analog) 1115; resistors 1106, 1108, 1110, 1114; capacitors 1102, 1104; and 28-port microcontroller 1027. The circuit elements of the microcontroller circuitry second portion are electrically interconnected as shown in FIG. 21. Preferred electrical characteristics for some of the elements of microcontroller circuitry second portion 1100 are set forth in parentheses in the following list: input 1112 (Charge_Supply); input 1116 (Batt+); resistor 1106 (143K); resistor 1108 (143K); resistor 1110 (1M0); resistor 1114 (1M0); capacitor 1102 (1 μF); capacitor 1104 (1 μF); microcontroller port 24 (RD6/AN6); and microcontroller port 26 (RD4/AN4).

Figure 22:
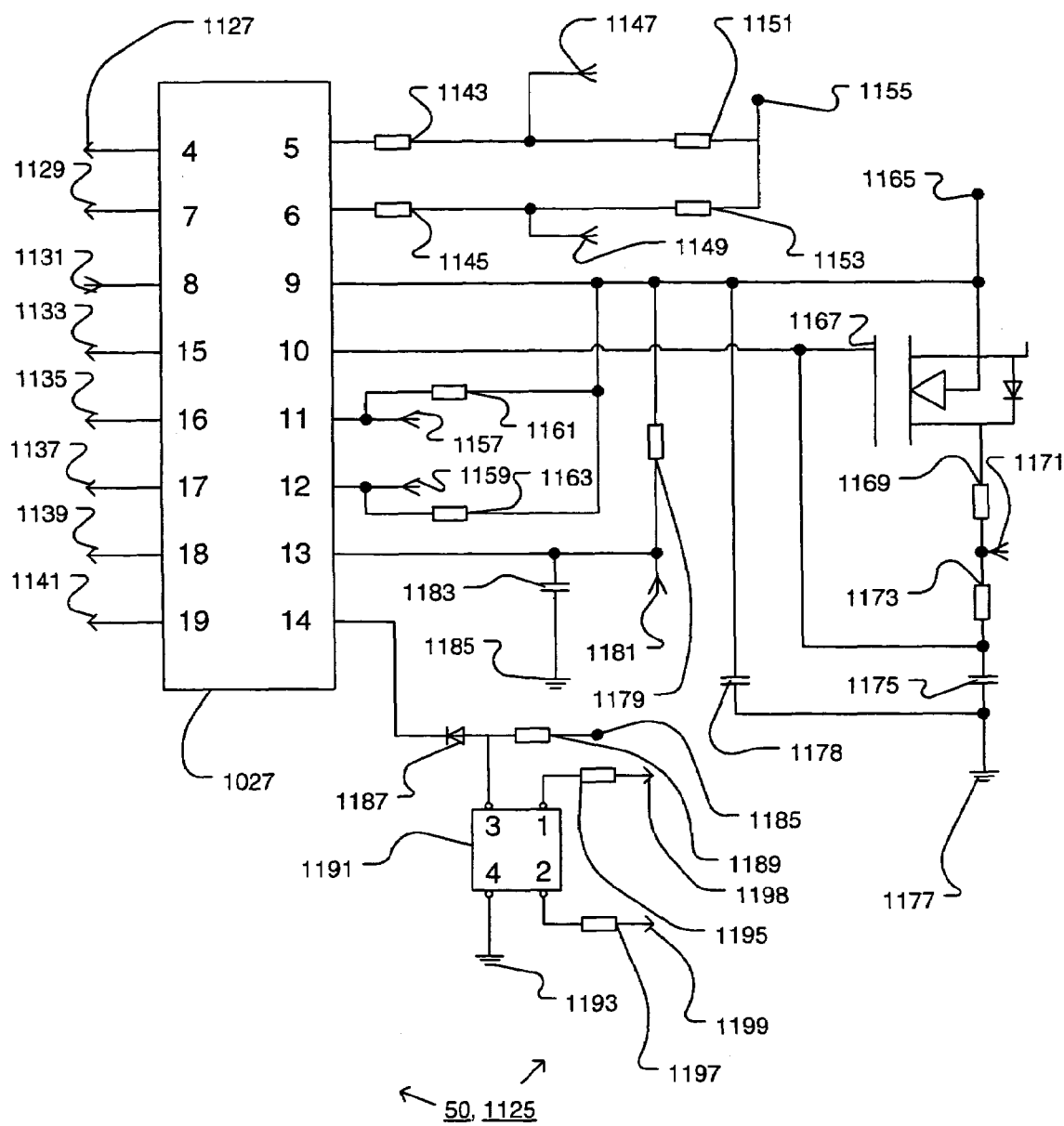
FIG. 22 is a microcontroller circuitry third portion of the first embodiment power supply.

Referring to FIG. 22, microcontroller circuitry third portion 1125 includes inputs 1131, 1147, 1149, 1157, 1159, 1171, 1181; outputs 1127, 1129, 1133, 1135, 1137, 1139, 1141, 1198, 1199; terminals 1155, 1165, 1185; ground (analog or digital as appropriate) 1177, 1185, 1193; resistors 1143, 1145, 1151, 1153, 1161, 1163, 1169, 1173, 1179, 1189, 1195, 1197; capacitors 1175, 1178, 1183; 28-port microcontroller 1027; component 1191; diode 1187; and component 1167. The circuit elements of the microcontroller circuitry third portion are electrically interconnected as shown in FIG. 22. Preferred electrical characteristics for some of the elements of microcontroller circuitry third portion 1125 are set forth in parentheses in the following list: input 1131 (Overcharge_monitor); input 1147 (SDAB); input 1149 (SCLB); input 1157 (SDAA); input 1159 (SCLA); input 1171 (Control_Power); input 1181 (Jack_Sense); output 1127 (Over_Current); output 1129 (Enable); output 1133 (LED1); output 1135 (Power_Enable); output 1137 (Pass_Mode); output 1139 (Charge_Discharge); output 1141 (Buck_Boost); output 1198 (SCLA); output 1199 (SDAA); terminal 1155 (+5.4V); terminal 1165 (+4.7V); terminal 1185 (+4.7V); resistor 1143 (121R); resistor 1145 (121R); resistor 1151 (100K); resistor 1153 (100K); resistor 1161 (100K); resistor 1163 (100K); resistor 1169 (121R); resistor 1173 (2M2); resistor 1179 (1M0); resistor 1189 (2K21); resistor 1195 (121R); resistor 1197 (121R); capacitor 1175 (0.1 μF); capacitor 1178 (0.1 μF); capacitor 1183 (0.01 μF); microcontroller 1027 port 4 (RD2/CMPB); microcontroller 1027 port 5 (RD1/SDAB); microcontroller 1027 port 6 (RD0/SCLB); microcontroller 1027 port 7 (OSC2/CLKOUT); microcontroller 1027 port 8 (OSC1/PBTN); microcontroller 1027 port 9 (VDD); microcontroller 1027 port 10 (VREG); microcontroller 1027 port 11 (RC7/SDAA); microcontroller 1027 port 12 (RC6/SCLA); microcontroller 1027 port 13 (RC5); microcontroller 1027 port 14 (MCLR/Vpp); microcontroller 1027 port 15 (RC4); microcontroller 1027 port 16 (Power_Enable); microcontroller 1027 port 17 (Pass_Mode); microcontroller 1027 port 18 (RC1/CMPA); microcontroller 1027 port 19 (RC0/REFA); diode 1187 (preferably model number BAV70); component 1167 (model IRLML2502).

Now that the microcontroller circuitry 1025, 1100, 1125 has been identified, its functionality will be briefly discussed. Microcontroller chip 1127 is preferably model PIC14000SS. Microcontroller 1027 controls the mode that the switching power supply operates in (e.g., buck charge, buck discharge, boost charge, boost discharge) and performs other important control functions.

Figures 23, 24:
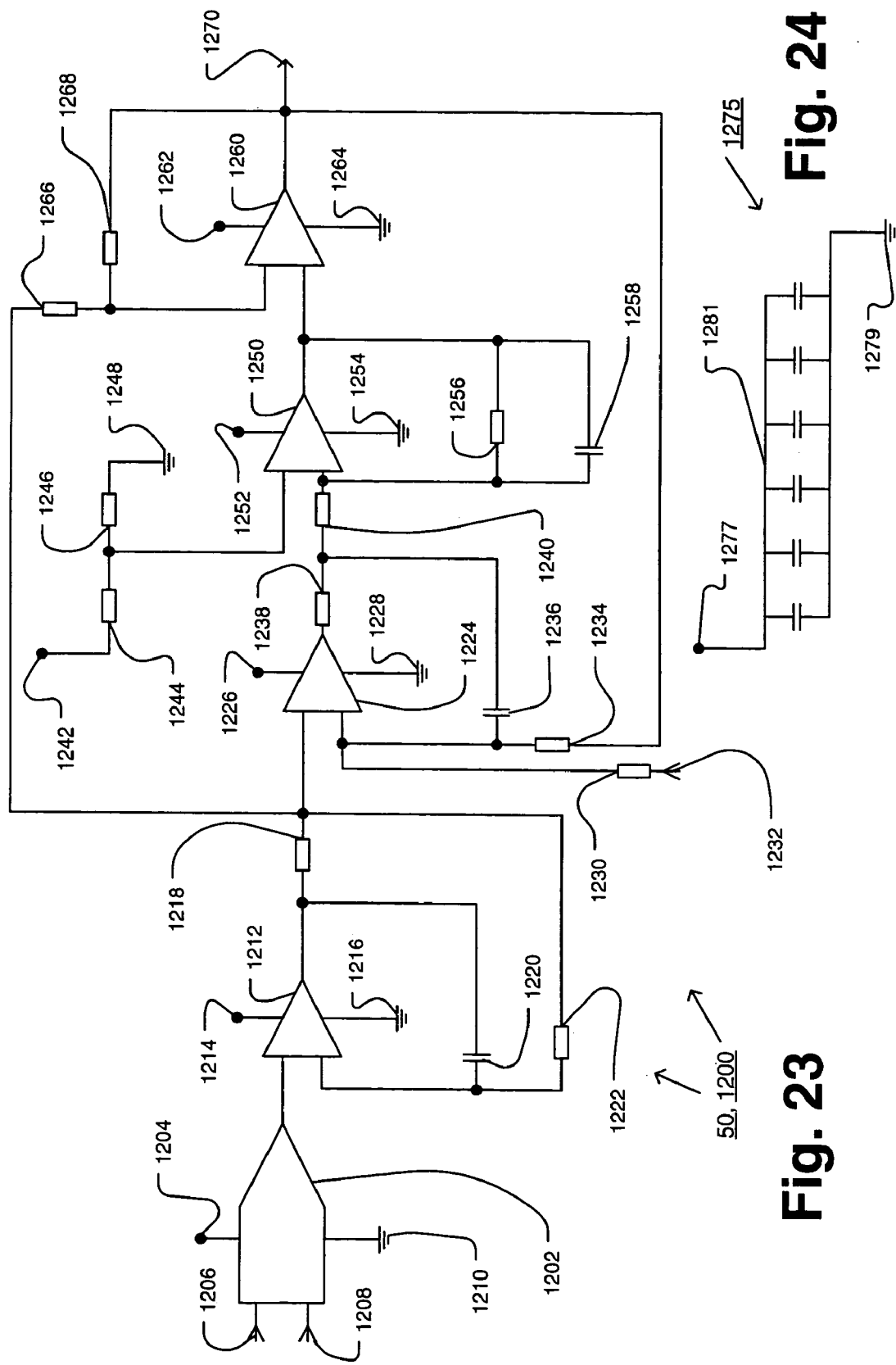
FIG. 23 is an oscillator circuitry of the first embodiment power supply.
FIG. 24 is a capacitor set for use in the first embodiment power supply.

Oscillator circuitry 1200 of FIG. 23 will now be explained by first identifying the constituent components, followed by discussion of the operation of the oscillator circuitry and its role in switching power supply 50. Referring to FIG. 23, oscillator circuitry 1200 includes inputs 1206, 1208, 1232; output 1270; terminals 1204, 1214, 1226, 1242, 1252, 1262; grounds (analog or digital as appropriate) 1210, 1216, 1228, 1248, 1254, 1264; resistors 1218, 1222, 1230, 1234, 1238, 1240, 1244, 1246, 1256, 1266, 1268; capacitors 1220, 1236, 1258; d-a converter 1202; operational amplifiers 1212, 1224, 1250; and comparator 1260. The circuit elements of the oscillator circuitry are electrically interconnected as shown in FIG. 23. Preferred electrical characteristics for some of the elements of oscillator circuitry 1200 are set forth in parentheses in the following list: input 1206 (SDAB); input 1208 (SCLB); input 1232 (Duty_Cycle_Control); output 1270 (osc_out); terminal 1204 (+5.4V); terminal 1214 (+5.4V); terminal 1226 (+5.4V); terminal 1242 (+5.4V); terminal 1252 (+5.4V); terminal 1262 (+5.4V); resistor 1218 (1K0); resistor 1222 (1K0); resistor 1230 (18K2); resistor 1234 (39K2); resistor 1238 (121R); resistor 1240 (1K0); resistor 1244 (100K); resistor 1246 (100K); resistor 1256 (1K0); resistor 1266 (100K); resistor 1268 (698K); capacitor 1220 (100 pF); capacitor 1236 (100 pF); capacitor 1258 (22 pF); operational amplifier 1212 (model TC1034); operational amplifier 1224 (model LMV710 made by National Semiconductor of Santa Clara, Calif.); operational amplifier 1250 (model LMV710); and comparator 1260 (model LMV7219 made by National Semiconductor).

Now that oscillator circuitry 1200 has been identified, its functionality will be briefly discussed. Inputs SDAB, SCLB and Duty_Cycle_Control are input to the oscillator circuitry to produce output osc_out. Inputs SDAB, SCLB are I²C format inputs that represent a voltage from 0-5 volts that forms a control signal to the oscillator. Duty_Cycle_Control is an analog signal. The output osc_out controls the oscillator.

Figure 42:
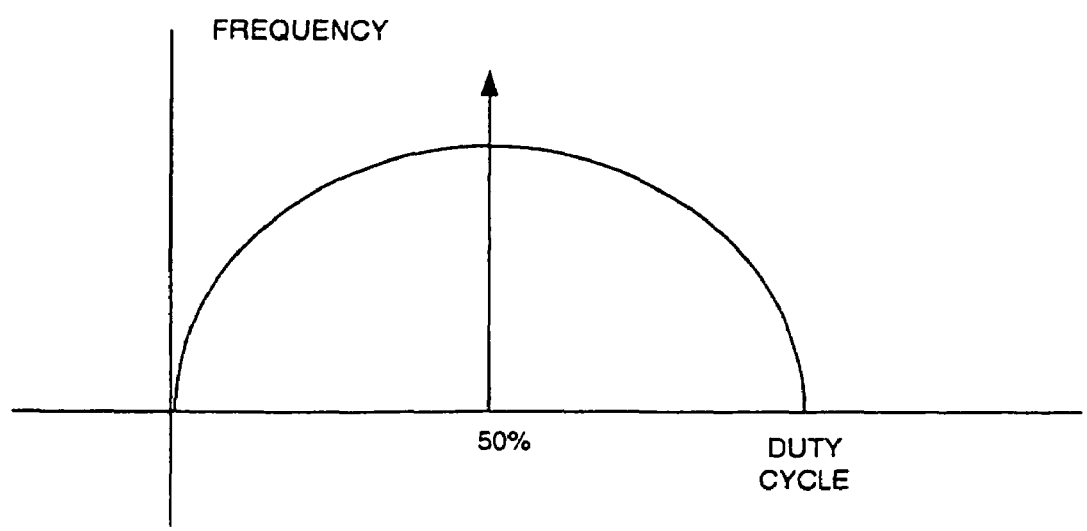
FIG. 42 is a graph showing a variable frequency, variable duty cycle relationship.

Oscillator circuitry 1200 produces an oscillation signal that has a variable duty cycle, a variable frequency and no fixed on-time or off-time for a duty cycle. This is different than conventional oscillators because conventional oscillators generally have at least one of the following restrictions: fixed frequency, fixed on time and/or fixed off time. By utilizing oscillator circuitry that can produce an oscillation signal having both a fixed frequency and no fixed on or off time, the multiple modes of operation (e.g., charge buck, charge boost, discharge buck, discharge boost) are greatly facilitated. For example, because there are no on or off time restrictions, duty cycles ranging from 0% to 100% are possible. This robust range of possible duty cycles helps make it possible to operate more efficiently and/or to achieve many different modes of operation. In exemplary oscillator circuitry 1200, the frequency range is dc operation up to a maximum of about 500 kHz. FIG. 42 is a graph, showing a generally parabola shaped relationship, of frequency versus duty cycle for oscillator circuitry 1200.

As shown in FIG. 24, capacitor set circuitry 1275 includes terminal 1277, six (6) parallel-connected capacitors 1281 and (preferably analog) ground 1279. Terminal 1277 is preferably at +5.4V. The 6 parallel-connected capacitors preferably each have a value of 0.1 µF. Capacitor set 1275 provides capacitance across selected portion(s) of oscillator circuitry 1200.

Figure 25:
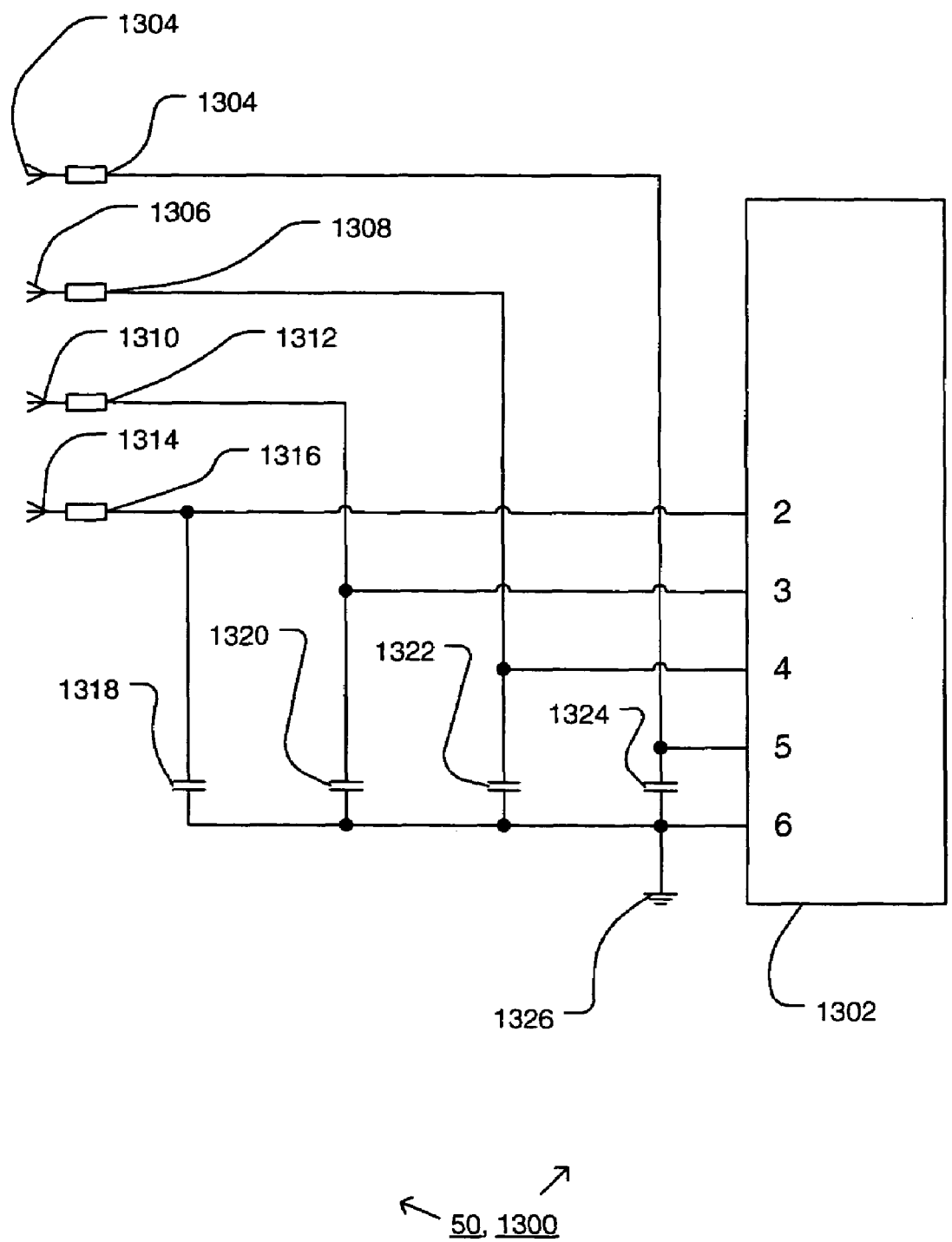
FIG. 25 is an overcharge protection circuitry first portion of the first embodiment power supply.

Overcharge protection circuitry 1300, 1350 of FIGS. 25 and 26 will now be explained by first identifying the constituent components in each of the Figs., followed by discussion of the operation of the overcharge protection circuitry and its role in switching power supply 50. Referring to FIG. 25, overcharge protection circuitry first portion 1300 includes inputs 1304, 1306, 1310, 1314; resistors 1304, 1308, 1312, 1316; capacitors 1318, 1320, 1322, 1324; (preferably digital) ground 1326; and 8-port overvoltage protection chip 1302. The circuit elements of the overcharge protection circuitry first portion are electrically interconnected as shown in FIG. 25. Preferred electrical characteristics for some of the elements of overcharge protection circuitry first portion 1300 are set forth in parentheses in the following list: input 1304 (Cell_1); input 1306 (Cell_2); input 1310 (Cell_3); input 1314 (Batt+); resistor 1304 (1K0); resistor 1308 (1K0); resistor 1312 (1K0); resistor 1316 (1K0); capacitor 1318 (0.1 µF); capacitor 1320 (0.1 µF); capacitor 1322 (0.1 µF); capacitor 1324 (0.1 µF); overvoltage protection chip 1302 port 2 (SENSE); overvoltage protection chip 1302 port 3 (VC1); overvoltage protection chip 1302 port 4 (VC2); overvoltage protection chip 1302 port 5 (VC3); overvoltage protection chip 1302 port 6 (VSS).

Figure 26:
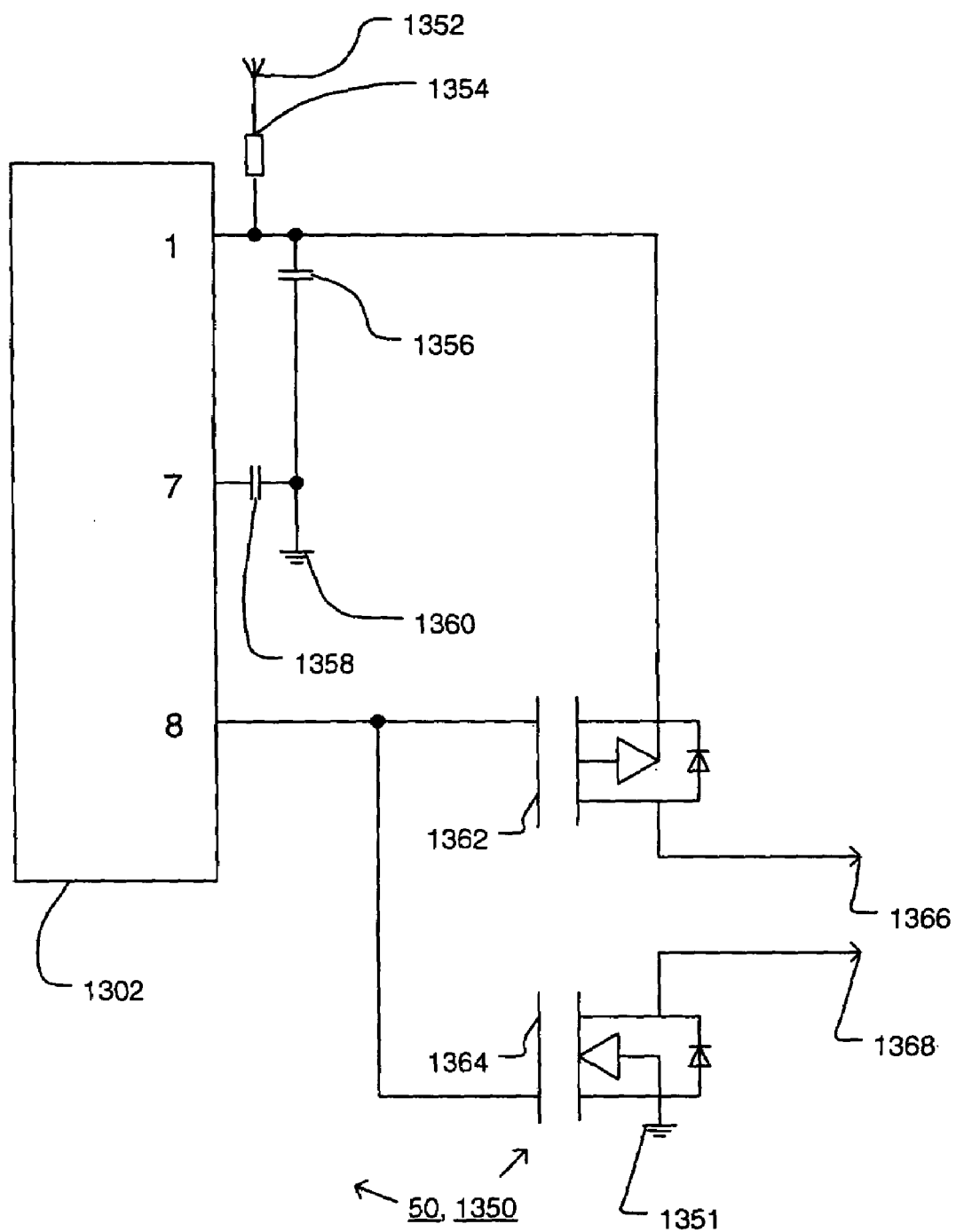
FIG. 26 is an overcharge protection circuitry second portion of the first embodiment power supply.

Referring to FIG. 26, overcharge protection circuitry second portion 1350 includes input 1352; outputs 1366, 1368; resistor 1354; capacitors 1356, 1358; (preferably digital) grounds 1351, 1360; overvoltage protection chip 1302; and FETs 1362, 1364. The circuit elements of the overcharge protection circuitry second portion are electrically interconnected as shown in FIG. 26. Preferred electrical characteristics for some of the elements of overcharge protection circuitry second portion 1350 are set forth in parentheses in the following list: input 1352 (Batt+); output 1366 (Overcharge); output 1368 (Overcharge_monitor); resistor 1354 (121R); capacitor 1356 (0.1 µF); capacitor 1358 (0.1 µF); FET 1362 (model IRF7509 made by International Rectifier); FET 1364 (model IRF7509); overvoltage protection chip 1302 port 1 (VCC); overvoltage protection chip 1302 port 7 (ICT); overvoltage protection chip 1302 port 8 (CO).

Now that overcharge protection circuitry 1300, 1350 has been identified, its functionality will be briefly discussed. It is conventional to use a pre-programmed overvoltage protection chip in conjunction with switching power supplies used for charging electrochemical cells. This redundant circuitry is warranted in this application because electrochemical cells can be damaged by overvoltage conditions and because overvoltage conditions may be: highly specific to electrochemical cell type and/or involve complex numerical or logical relationships. More particularly, overvoltage 1302 is preferably model S-8244AAHFN-CEH-T2 made by Seiko. The Overcharge signal output by overcharge protection circuitry overrides any inconsistent signals being put out by the microprocessor in its normal control of operation of the switching power supply. The Overcharge_monitor signal output by overcharge protection circuitry communicates to the microprocessor that the overriding Overcharge output signal is in effect.

Programmable logic circuitry 1400, 1450, 1500, 1550, 1600, 1625, 1650, 1675, 1700, 1710, 1720, 1730 of FIGS. 27 through 38 will now be explained by first identifying the constituent components in each of the Figs., followed by discussion of the operation of the programmable logic circuitry and its role in switching power supply 50. Programmable logic circuitry first through fourth portions 1400, 1450, 1500, 1550, as shown in FIGS. 27 through 30, include circuitry connected to programmable logic chip 1402 (preferably model number LC4032ZC made by Lattice Semiconductor).

Figure 27:
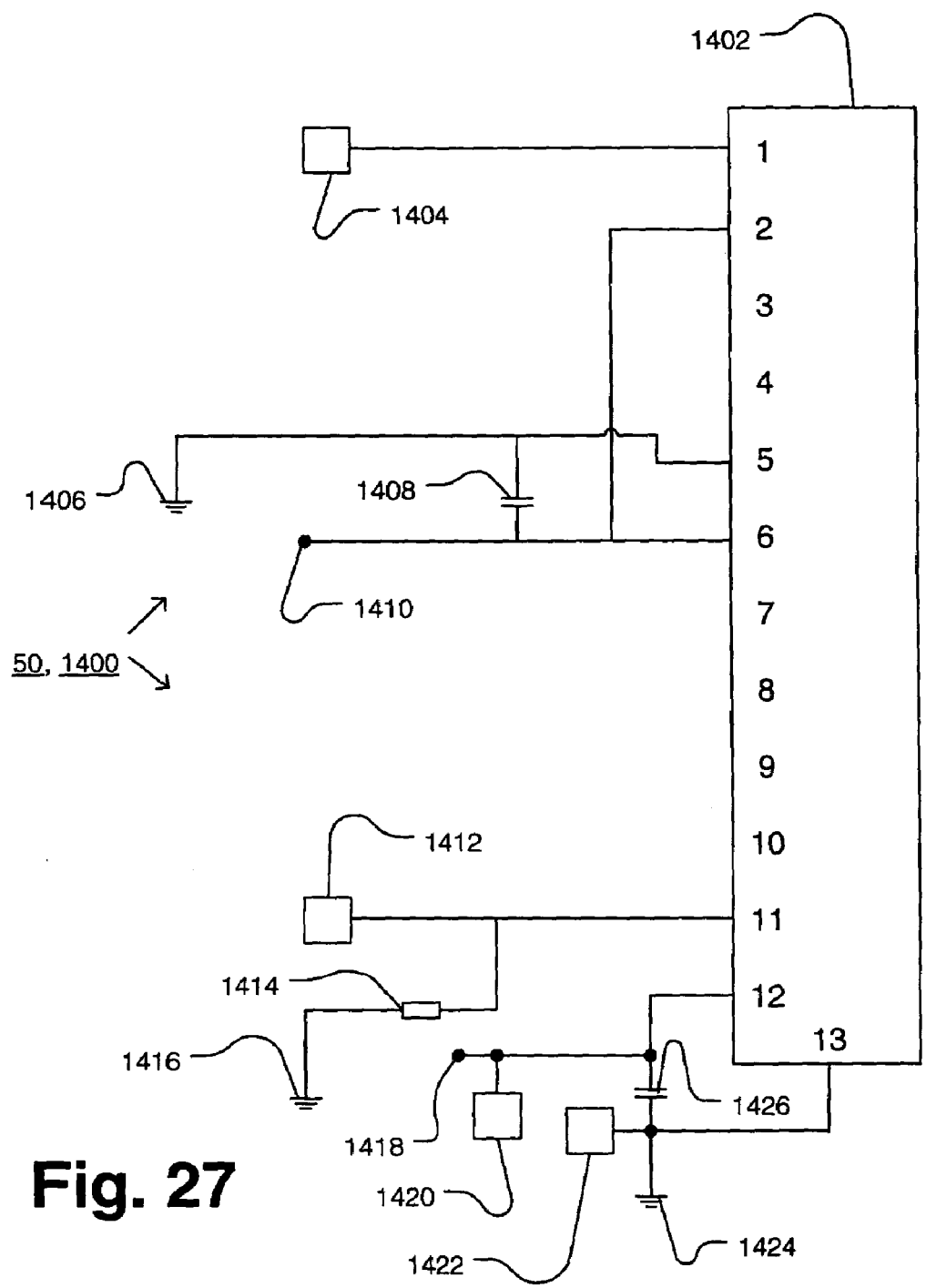
FIG. 27 is a programmable logic first portion of the first embodiment power supply.

Referring to FIG. 27, programmable logic circuitry first portion 1400 includes terminals 1410, 1418; resistor 1414; capacitors 1408, 1426; (preferably digital) grounds 1406, 1416, 1424; programmable logic chip 1402; and test points 1404, 1412, 1420, 1422. The circuit elements of the programmable logic circuitry first portion are electrically interconnected as shown in FIG. 27. Preferred electrical characteristics for some of the elements of programmable logic circuitry first portion 1400 are set forth in parentheses in the following list: terminal 1410 (+3.3V); terminal 1418 (+1.8V); resistor 1414 (4K75); capacitor 1408 (0.1 µF); capacitor 1426 (0.1 µF); programmable logic chip 1402 port 1 (TD1); programmable logic chip 1402 port 2 (A5); programmable logic chip 1402 port 3 (A6); programmable logic chip 1402 port 4 (A7); programmable logic chip 1402 port 5 (GND (Bank0)); programmable logic chip 1402 port 6 (VCC(Bank0)); programmable logic chip 1402 port 7 (A8); programmable logic chip 1402 port 8 (A9); programmable logic chip 1402 port 9 (A10); programmable logic chip 1402 port 10 (A11); programmable logic chip 1402 port 11 (TCK); programmable logic chip 1402 port 12 (VCO); and programmable logic chip 1402 port 13 (GND).

Referring to FIG. 28, programmable logic circuitry second portion 1450 includes inputs 1452, 1454, 1456, 1458, 1460, 1462, 1464; and programmable logic chip 1402. The circuit elements of the programmable logic circuitry second portion are electrically interconnected as shown in FIG. 28. Preferred electrical characteristics for some of the elements of programmable logic circuitry first portion 1400 are set forth in parentheses in the following list: input 1452 (Enable); input 1454 (Predictor_Output); input 1456 (seriesa); input 1458 (shunta); input 1460 (Pass_Mode); output 1462 (Node_Control); input 1464 (Charge_Discharge); programmable logic chip 1402 port 14 (A12); programmable logic chip 1402 port 15 (A13); programmable logic chip 1402 port 16 (A14); programmable logic chip 1402 port 17 (A15); programmable logic chip 1402 port 18 (CLK1/I); programmable logic chip 1402 port 19 (CLK2/I); programmable logic chip 1402 port 20 (B0); programmable logic chip 1402 port 21 (B1); programmable logic chip 1402 port 22 (B2); programmable logic chip 1402 port 23 (B3); programmable logic chip 1402 port 24 (B4).

Figure 29:
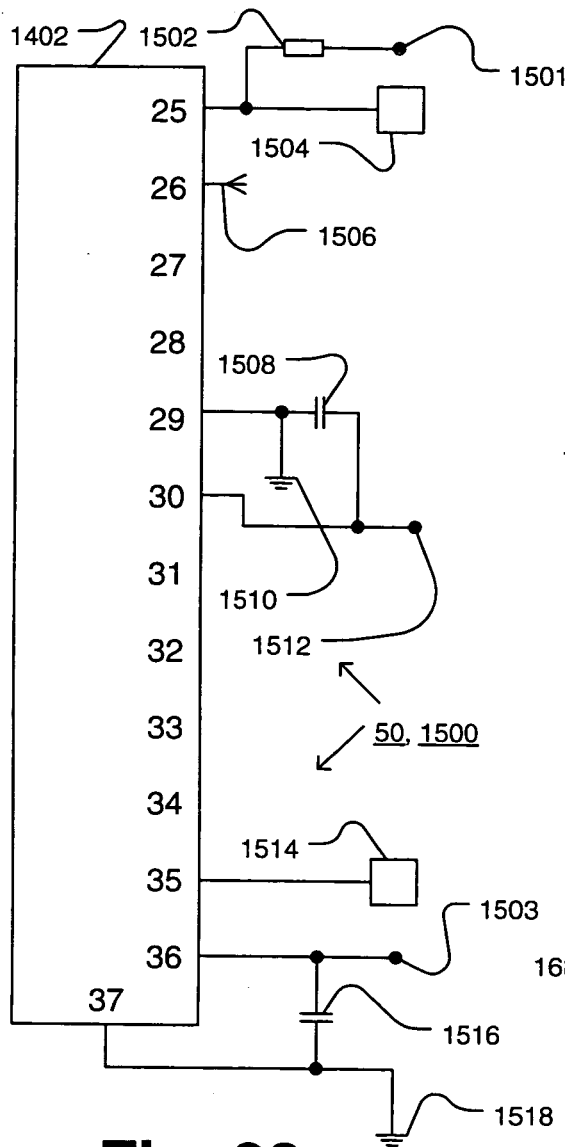
FIG. 29 is a programmable logic third portion of the first embodiment power supply.

Referring to FIG. 29, programmable logic circuitry third portion 1500 includes input 1506; terminals 1501, 1503, 1512; resistor 1502; capacitors 1508, 1516; (preferably digital) grounds 1510, 1518; programmable logic chip 1402; and test points 1504, 1514. The circuit elements of the programmable logic circuitry first portion are electrically interconnected as shown in FIG. 29. Preferred electrical characteristics for some of the elements of programmable logic circuitry third portion 1500 are set forth in parentheses in the following list: input 1506 (oc_signal); terminal 1501 (+1.8V); terminal 1503 (+1.8V); terminal 1512 (+3.3V); resistor 1502 (4K75); capacitor 1508 (0.1 µF); capacitor 1516 (0.1 µF); programmable logic chip 1402 port 25 (TMS); programmable logic chip 1402 port 26 (B5); programmable logic chip 1402 port 27 (B6); programmable logic chip 1402 port 28 (B7); programmable logic chip 1402 port 29 (GND(Bank1)); programmable logic chip 1402 port 30 (VCCO(Bank1)); programmable logic chip 1402 port 31 (B8); programmable logic chip 1402 port 32 (B9); programmable logic chip 1402 port 33 (B10); programmable logic chip 1402 port 34 (B11); programmable logic chip 1402 port 35 (TD0); programmable logic chip 1402 port 36 (VCC); and programmable logic chip 1402 port 37 (GND).

Referring to FIG. 30, programmable logic circuitry fourth portion 1550 includes inputs 1552, 1554, 1558, 1560; output 1556; terminal 1576; resistors 1562, 1564, 1572; capacitors 1565, 1566, 1574; (preferably digital) grounds 1568, 1580; programmable logic chip 1402; inverter 1570; and inverter 1578. The circuit elements of the programmable logic circuitry fourth portion are electrically interconnected as shown in FIG. 30. Preferred electrical characteristics for some of the elements of programmable logic circuitry fourth portion 1550 are set forth in parentheses in the following list: input 1552 (Buck_Boost); input 1554 (seriesb); input 1558 (shuntb); input 1560 (osc_out); output 1556 (Integrator_Reset); terminal 1576 (+5.4V); resistor 1562 (10R0); resistor 1564 (499R); resistor 1572 (499R); capacitor 1565 (100 pF); capacitor 1566 (100 pF); capacitor 1574 (100 pF); inverter 1570 (model 74VHCT14PW); and inverter 1578 (model 74VHCT14PW); programmable logic chip 1402 port 38 (B12); programmable logic chip 1402 port 39 (B13); programmable logic chip 1402 port 40 (B14); programmable logic chip 1402 port 41 (B15/GOE1); programmable logic chip 1402 port 42 (CLK3/I); programmable logic chip 1402 port 43 (CLK0/I); programmable logic chip 1402 port 44 (A0/GOE0); programmable logic chip 1402 port 45 (A1); programmable logic chip 1402 port 46 (A2); programmable logic chip 1402 port 47 (A3); and programmable logic chip 1402 port 48 (A4).

Inverters 1570, 1578 and their associated resistor-capacitor network preferably condition the waveform of the osc_out input signal, as well as providing some phase shifting. One reason for the phase shifting is to help avoid shoot-through. Shoot-through happens when small overlaps between turning the various FETS on and off occur. These shoot-through overlaps cause transient, inefficient power transfers in the passive circuitry of the switching power supply. Therefore, by preventing shoot-through by phase shifting, the switching power supply is improved in efficiency.

Referring to FIG. 31, programmable logic circuitry fifth portion 1600 includes terminals 1604, 1614; capacitors 1606, 1610, 1612; (preferably digital) ground 1608; and voltage regulator 1602 (preferably model number LT1761-3.3 made by Linear Technology). The circuit elements of the programmable logic circuitry fifth portion are electrically interconnected as shown in FIG. 31. Preferred electrical characteristics for some of the elements of programmable logic circuitry fifth portion 1600 are set forth in parentheses in the following list: terminal 1604 (+5.4V); terminal 1614 (+3.3V); capacitor 1606 (1 µF); capacitor 1610 (0.01 µF); capacitor 1612 (1 µF); voltage regulator 1602 port 1 (VIN); voltage regulator 1602 port 2 (GND); voltage regulator 1602 port 3 (SHDN); voltage regulator 1602 port 4 (BYP); and voltage regulator 1602 port 5 (VOUT).

Referring to FIG. 32, programmable logic circuitry sixth portion 1625 includes terminals 1629, 1639; capacitors 1631, 1635, 1637; (preferably digital) ground 1633; and voltage regulator 1627 (preferably model number LT1761-1.8 made by Linear Technology). The circuit elements of the programmable logic circuitry sixth portion are electrically interconnected as shown in FIG. 32. Preferred electrical characteristics for some of the elements of programmable logic circuitry fifth portion 1600 are set forth in parentheses in the following list: terminal 1629 (+5.4V); terminal 1639 (+1.8V); capacitor 1631 (1 µF); capacitor 1635 (0.01 µF); capacitor 1637 (1 µF); voltage regulator 1627 port 1 (VIN); voltage regulator 1627 port 2 (GND); voltage regulator 1627 port 3 (SHDN); voltage regulator 1627 port 4 (BYP); and voltage regulator 1627 port 5 (VOUT). Voltage regulators 1602, 1627 respectively provide the +3.3V (terminal 1614) and +1.8V (terminal 1639) required by the low power microcontroller.

Figure 33:
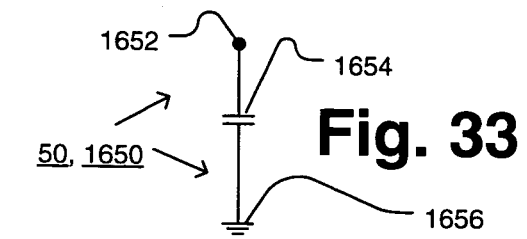
FIG. 33 is a programmable logic seventh potion of the first embodiment power supply.

Referring to FIG. 33, programmable logic circuitry sixth portion 1650 includes +5.4V terminal 1652; 0.1 µF capacitor 1654; and (preferably digital) ground 1656. Programmable logic sixth portion provides capacitance across selected portion(s) of the programmable logic circuitry.

Figure 34:
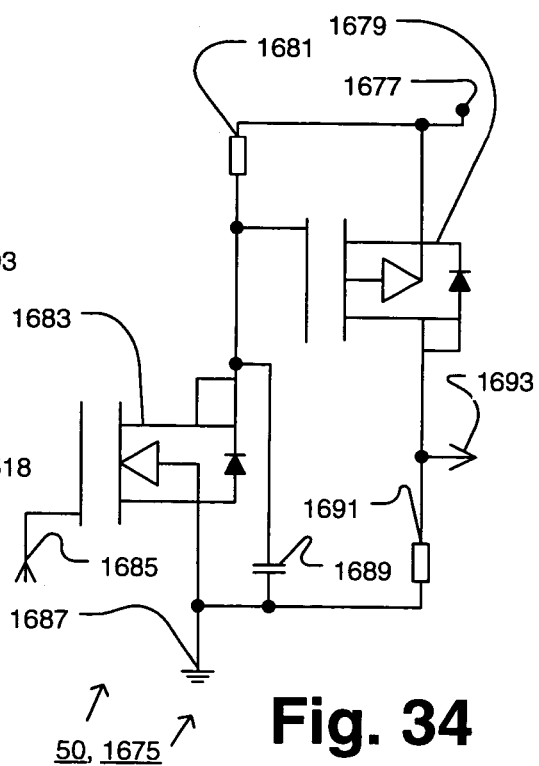
FIG. 34 is a programmable logic eighth potion of the first embodiment power supply.

Referring to FIG. 34, programmable logic circuitry eighth portion 1675 includes input 1685; output 1693; terminal 1677; capacitor 1689; (preferably digital) ground 1687; resistors 1681, 1691; and FETs 1679, 1683. The circuit elements of the programmable logic circuitry eighth portion are electrically interconnected as shown in FIG. 34. Preferred electrical characteristics for some of the elements of programmable logic circuitry eighth portion 1675 are set forth in parentheses in the following list: input 1685 (Over_Current);

output 1693 (oc_signal); terminal 1677 (+5.4V); capacitor 1689 (0.01 μF); resistor 1681 (221K); resistor 1691 (10K0); and FET 1679 (model IRF7509 made by International Rectifier); and FET 1683 (model IRF7509).

Referring to FIG. 35, programmable logic circuitry ninth portion 1700 includes input 1702 (shunta); inverter 1704 (preferably model 74VHCT14PW); and output 1706 (Shunta_In). Referring to FIG. 36, programmable logic circuitry tenth portion 1710 includes input 1712 (seriesa); inverter 1714 (preferably model 74VHCT14PW); and output 1716 (Seriesa_In). Referring to FIG. 37, programmable logic circuitry eleventh portion 1720 includes input 1722 (shuntb); inverter 1724 (preferably model 74VHCT14PW); and output 1726 (Shuntb_In). Referring to FIG. 38, programmable logic circuitry twelfth portion 1730 includes input 1732 (seriesb); inverter 1734 (preferably model 74VHCT14PW); and output 1736 (Seriesb_In). Inverters 1704, 1714, 1724, 1734 act as inverters and buffers with respect to their respective signals. Programmable logic circuitry ninth to twelfth portions 1700, 1710, 1720, 1730 impart sharp rising edges on the output signals. To explain, the input signals come from the microprocessor, which is a low power device that consequently cannot impart sharp rising edges. So, the rising edges are sharpened by circuitry 1710, 1720, 1730, 1700 so that the output signals (Shunta_In, Seriesa_In, Shuntb_In, Seriesb_In) can be accurately processed by the amplifier.

Now that the twelve portions of the programmable logic circuitry have been identified, its functionality will be briefly discussed. Programmable logic chip 1402 is preferably a multiple times programmable logic chip. Preferably, the programmable logic chip is programmable only by a lab technician and not: (1) easily reprogrammable by an end-consumer; and/or (2) programmable by circuitry in the switching power supply (e.g., microcontroller). The above-mentioned test points are utilized in this technician programming process.

The programmable logic chip organizes the inventive multiple mode operation of the switching power supply. Specifically, the programmable logic chip stores multiple variable truth tables, with input variables corresponding to mode of operation and other operating conditions as appropriate. Alternatively, this organization of the modes could be accomplished in the microcontroller. However, by using a separate, dedicated programmable logic chip, the organizational functionality can be handled much more quickly, which is especially important in the context of a high efficiency switching power supply. As a further alternative, this organization of the modes could be accomplished by discrete logic components. However, by using a separate, dedicated programmable logic chip, the organizational functionality can be handled in less space and with less complexity of hardware.

Zero current predictor circuitry 1750 of FIG. 39 will now be explained by first identifying the constituent components, followed by discussion of the operation of the zero current predictor circuitry and its role in switching power supply 50. Referring to FIG. 39, zero current predictor circuitry 1750 includes inputs 1754, 1762, 1764, 1765, 1768, 1796; output 1789; terminals 1758, 1770, 1774, 1788, 1798; resistors 1780, 1782; capacitors 1778, 1784; (preferably analog) grounds 1756, 1769, 1776, 1790, 1794; analog switches 1760, 1766, 1792; and comparators 1772, 1786. The circuit elements of the zero current predictor circuitry are electrically interconnected as shown in FIG. 39. Preferred electrical characteristics for some of the elements of zero current predictor circuitry 1750 are set forth in parentheses in the following list: input 1754 (Node_Control); input 1762 (Node_A_Signal); input 1764 (Node_B_Signal); input 1765 (Node_A_Signal); input 1768 (Node_Control); input 1796 (Integrator_Reset); output 1789 (Predictor_Output); terminal 1758 (5.4V); terminal 1770 (5.4V); terminal 1774 (5.4V); terminal 1788 (5.4V); terminal 1798 (5.4V); resistor 1780 (121R); resistor 1782 (121R); capacitor 1778 (220 pF); capacitor 1784 (10 pF); switch 1760 port 1 (Select); switch 1760 port 2 (V+); switch 1760 port 3 (GND); switch 1760 port 4 (NO); switch 1760 port 5 (COM); switch 1760 port 6 (NC); switch 1766 port 1 (Select); switch 1766 port 2 (V+); switch 1766 port 3 (GND); switch 1766 port 4 (NO); switch 1766 port 5 (COM); switch 1766 port 6 (NC); comparator 1772 (model LMV710); comparator 1786 (model LMV7219); and switch 1792 port 1 (COM); switch 1792 port 2 (NO); switch 1792 port 3 (GND); switch 1792 port 4 (ENABLE); switch 1792 port 5 (V+); switch 1760 (model NLAS4599 made by ON Semiconductor); switch 1766 (model NLAS4599); and 1792 (model NLAS4501 made by ON Semiconductor).

Now that zero current predictor circuitry 1750 has been identified, its functionality will be briefly discussed. Because power supply 50 uses MOSFET power supply switches to form current path(s) between an inductor and a capacitor (see FIG. 3b at reference numerals 253, 255, 269, 279, 273), and because the supply is sometimes operated in synchronous operation, it is critical to make sure that the inductor current does not get down to zero because that could lead to the bad inefficiency of reverse current, wherein the inductor pulls charge from the output capacitor. Therefore, special care is taken to make sure that the MOSFET is closed art least slightly before inductor current reaches zero.

This special care takes the form of zero current predictor circuitry 1750. Zero current predictor circuitry uses the voltage across the inductor (see FIG. 3b at reference numerals 253, 255) to control a constant current through capacitor 1778. The capacitor voltage level proportionally mirrors the inductor current. This is because rate of change in current in an inductor as a function of voltage is proportional to the rate of change in the voltage of a capacitor at a given current level. So, capacitor 1778 voltage proportionally mimics the inductor current level, as inductor current varies over time.

Zero current predictor detects the rate of change in capacitor 1778 voltage. Comparator 1772 and associated circuitry acts as an integrator that continually integrates the detected rate of change in voltage to determine the capacitor voltage at any given point in time of operation. If determined capacitor voltage gets too close to zero, then it is effectively predicted that inductor current will reach zero. Therefore, when the integrated capacitor voltage falls below a minimum threshold level, comparator 1786 outputs the Predictor_Output signal to turn off the associated power supply switch before inductor current has an opportunity to reach zero. Analog switch 1792 resets, or shorts, capacitor 1778 when the Predictor_Output signal indicates a zero current prediction. This prevents cumulative integration of measurement errors.

The zero current predictor is utilized to prevent reverse current flow. The current predictor works by sensing the voltage across an inductor and/or the rate of change of voltage across an inductor. This zero current predictor is believed to be especially advantageous in synchronous switching power supplies. This zero current prediction is different than power supply control methods for measuring the current in the inductor for the express for purpose of limiting the current peaks to prevent inductor saturation and FET damage, and to provide current regulation without the use of a current shunt. This is done in various manners all with the intent of knowing what the current is at a specific point in time. The zero current prediction approach is quite different in that respect. The zero current prediction approach does not necessarily make any effort to realize the absolute value of current. Rather, the zero current prediction method predicts when the current might be zero, for the purpose of improving efficiency. This is different than conventional devices that make efforts to actually measure the current, for both peak current control and reverse current prevention (occurs after current reaches zero.) One of the basic problems with this approach is, of course, it is very difficult to measure very small currents. The present invention avoids that by not measuring actual current but by "predicting when it "might" be zero. The approach has resulted in some significant improvements in efficacy. This kind of zero current predictor can prevent inductor from getting down to zero current as synchronous FETs are switching on and off. The rate of change of current in an inductor can be mimicked by the rate of change of voltage in a capacitor, which is the preferred way of performing zero current prediction according to the present invention.

FIG. 40 shows decoupling capacitor set 1800, for use in the present invention, including +5.4 V terminal 1802, ground 1806; and six capacitors connected in parallel 1804. Of the six parallel-connected capacitors, five are preferably 0.1 µF and the remaining capacitor is preferably 1 µF. The use of both 0.1 µF and 1 µF capacitors causes decoupling at both high and low frequencies.

Many variations on the above-described embodiments of this invention are possible. The fact that a product or process exhibits differences from one or more of the above-described exemplary embodiments does not mean that the product or process is outside the scope (literal scope and/or other legally-recognized scope) of the following claims.

Definitions

The following definitions are provided to facilitate claim interpretation and claim construction:

Present invention: means at least some embodiments of the present invention; references to various feature(s) of the "present invention" throughout this document do not mean that all claimed embodiments or methods include the referenced feature(s).

First, second, third, etc. ("ordinals"): Unless otherwise noted, ordinals only serve to distinguish or identify (e.g., various members of a group); the mere use of ordinals implies neither a consecutive numerical limit nor a serial limitation.

Power signal: any electrical power flow caused primarily for the purpose of transferring electrical power, regardless of whether the "signal" includes any informational component (generally it will not) and regardless of whether some or all of the power is not transferred (for example, in some embodiments, some of the power will be used to run the switching power supply and therefore there will be some power from the power signal that is not transferred in these embodiments, even though electrical power transfer is still the primary purpose of the power signal.

To the extent that the definitions provided above are consistent with ordinary, plain, and accustomed meanings (as generally shown by documents such as dictionaries and/or technical lexicons), the above definitions shall be considered controlling and supplemental in nature. To the extent that the definitions provided above are inconsistent with ordinary, plain, and accustomed meanings (as generally shown by documents such as dictionaries and/or technical lexicons), the above definitions shall control. If the definitions provided above are broader than the ordinary, plain, and accustomed meanings in some aspect, then the above definitions shall be considered to broaden the claim accordingly.

To the extent that a patentee may act as its own lexicographer under applicable law, it is hereby further directed that all words appearing in the claims section, except for the above-defined words, shall take on their ordinary, plain, and accustomed meanings (as generally shown by documents such as dictionaries and/or technical lexicons), and shall not be considered to be specially defined in this specification. Notwithstanding this limitation on the inference of "special definitions," the specification may be used to evidence the appropriate ordinary, plain and accustomed meanings (as generally shown by dictionaries and/or technical lexicons), in the situation where a word or term used in the claims has more than one alternative ordinary, plain and accustomed meaning and the specification is actually helpful in choosing between the alternatives.

What is claimed is:

1. A switching power supply comprising:
    at least one power signal input structured as circuitry for providing an input electrical power signal to the switching power supply;
    at least one power signal output structured as circuitry for providing an output electrical power signal from the switching power supply;
    a passive component set comprising at least one passive component;
    an active component set comprising at least one power supply switch, said at least one power supply switch having a gate and a drain, with the active component set being electrically interconnected to the passive component set so that a switch position of the at least one power supply switch at least partially controls the flow of electrical power through the passive component set;
    driver/controller circuitry structured to control at least the opening and closing of the at least one switch of the active component set, with the driver/controller circuitry, the active component set and the passive component set being structured, programmed and/or electrically interconnected to convert the input electrical power signal into a desired output electrical power signal;
    wherein the driver/controller circuitry comprises gate reference voltage generator circuitry structured and electrically interconnected to apply a gate reference voltage to the gate, with the gate reference voltage being offset from a drain voltage in an amount reasonable to compensate for gate capacitance effect on the gate voltage; and
    wherein the switching power supply has an electrical power efficiency generally greater than 95% at operating voltages.

2. The supply of claim 1 wherein:
    the driver/controller circuitry comprises gate driver circuitry outputting a gate driver signal for driving the gate voltage at the gate, with a rising edge of the gate driver signal being less than 15 nanoseconds in duration.

3. The supply of claim 2 wherein a rising edge of the gate driver signal is less than 10 nanoseconds in duration.

4. A switching power supply comprising:
    at least one power signal input structured as circuitry for providing an input electrical power signal to the switching power supply;
    at least one power signal output structured as circuitry for providing an output electrical power signal from the switching power supply;
    a passive component set comprising at least one passive component;
    an active component set comprising at least a first power supply switch, with the active component set being electrically interconnected to the passive component set so that a switch position of the first power supply switch at least partially controls the flow of electrical power through the passive component set, with the first power supply switch comprising:

a source having a source voltage, a drain having a drain voltage, and a gate having a gate voltage referenced to a gate reference voltage; and driver/controller circuitry structured to control at least the opening and closing of the at least one switch of the active component set, with the driver/controller circuitry, the active component set and the passive component set being structured, programmed and/or electrically interconnected to convert the input electrical power signal into a desired output electrical power signal;

wherein the driver controller circuitry comprises gate reference voltage generator circuitry structured and electrically interconnected to apply the gate reference voltage to the gate, with the gate reference voltage being offset from the drain voltage in an amount reasonable to compensate for gate capacitance effect on the gate voltage.

5. The supply of claim 4 wherein:

the first power supply switch further comprises inherent gate-to-source capacitance and inherent gate-to-drain capacitance;

the gate capacitance ratio is defined as the gate-to-source capacitance divided by the gate-to-drain capacitance; and the gate reference voltage generator determines the gate capacitance effect as:

source voltage-drain voltage gate capacitance ratio.

6. The supply of claim 5 wherein the gate reference voltage generator offsets the gate reference voltage from the drain voltage by an amount at least approximately equal to the determined gate capacitance effect.

7. The supply of claim 5 wherein the first power supply switch is a FET.

8. The supply of claim 7 wherein the supply further comprises a second power supply switch, constructed as a FET, with the first and second power supply switches being electrically interconnected so that there is a potential for phantom switching that is reduced or eliminated by the offsetting of the gate reference voltage by the gate reference voltage generator.

9. The supply of claim 7 wherein the first power supply switch is a MOSFET.

10. A switching power supply comprising:

at least one power signal input structured as circuitry for providing an input electrical power signal to the switching power supply;

at least one power signal output structured as circuitry for providing an output electrical power signal from the switching power supply;

a passive component set comprising at least one passive component;

an active component set comprising at least a first power supply switch, with the active component set being electrically interconnected to the passive component set so that a switch position of the first power supply switch at least partially controls the flow of electrical power through the passive component set, wherein the first power supply switch comprising:

a source having a source voltage, a drain having a drain voltage, a gate having a gate voltage referenced to a gate reference voltage, an inherent gate-to-source capacitance, and inherent gate-to-drain capacitance, with the gate capacitance ratio is defined as the gate-to-source capacitance divided by the gate-to-drain capacitance; and driver/controller circuitry structured to control at least the opening and closing of the at least one switch of the active component set, with the driver/controller circuitry, the active component set and the passive component set being structured, programmed and/or electrically interconnected to convert the input electrical power signal into a desired output electrical power signal;

wherein the driver/controller circuitry comprises gate reference voltage generator circuitry structured and electrically interconnected to apply the gate reference voltage to the gate, with the gate reference voltage being offset from the drain voltage in an amount reasonable to compensate for gate capacitance effect on the gate voltage; and wherein the gate capacitance ratio is less than 0.1.

11. The supply of claim 10 wherein the gate capacitance ratio is equal to or less than 0.05.

* * * * *